(12) United States Patent
Sato et al.

(10) Patent No.: US 8,884,373 B2
(45) Date of Patent: Nov. 11, 2014

(54) SEMICONDUCTOR DEVICE

(71) Applicant: Panasonic Corporation, Kadoma (JP)

(72) Inventors: Yoshihiro Sato, Toyama (JP); Hideyuki Arai, Toyama (JP); Takayuki Yamada, Toyama (JP)

(73) Assignee: Panasonic Corporation, Osaka (JP)

( * ) Notice: Subject to any disclaimer, the term of this patent is extended or adjusted under 35 U.S.C. 154(b) by 5 days.

(21) Appl. No.: 13/665,376

(22) Filed: Oct. 31, 2012

(65) Prior Publication Data
US 2013/0056832 A1 Mar. 7, 2013

Related U.S. Application Data

(63) Continuation of application No. PCT/JP2011/006167, filed on Nov. 4, 2011.

(30) Foreign Application Priority Data

Mar. 25, 2011 (JP) .................................. 2011-068131

(51) Int. Cl.
*H01L 27/092* (2006.01)
*H01L 21/8238* (2006.01)
*H01L 21/768* (2006.01)
*H01L 27/11* (2006.01)
*H01L 27/105* (2006.01)
*H01L 21/285* (2006.01)

(52) U.S. Cl.
CPC .. *H01L 21/823842* (2013.01); *H01L 21/76895* (2013.01); *H01L 27/1116* (2013.01); *H01L 27/1104* (2013.01); *H01L 27/105* (2013.01); *H01L 21/28518* (2013.01); *Y10S 257/903* (2013.01)
USPC ..... 257/369; 257/392; 257/903; 257/E27.098

(58) Field of Classification Search
USPC ............................ 257/392, 903, E27.098, 369
See application file for complete search history.

(56) References Cited

U.S. PATENT DOCUMENTS

| 2003/0107090 A1 | 6/2003 | Kumeno |
| 2008/0036010 A1* | 2/2008 | Tamaki et al. ................ 257/372 |

FOREIGN PATENT DOCUMENTS

| JP | 6-275788 A | | 9/1994 | |
| JP | 8-017934 A | | 1/1996 | |
| JP | 2010-067912 | * | 3/2010 | .......... H01L 21/0238 |
| JP | 2010-067912 A | | 3/2010 | |

OTHER PUBLICATIONS

International Search Report issued in International Application No. PCT/JP2011/006167 oissued on Jan. 24, 2011.

* cited by examiner

*Primary Examiner* — Fernando L Toledo
*Assistant Examiner* — Lawrence-Linh T Nguyen
(74) *Attorney, Agent, or Firm* — McDermott Will & Emery LLP

(57) ABSTRACT

A first dual-gate electrode includes a gate electrode located on a first active region and having a first silicon film of a first conductivity type and a gate electrode located on a second active region and having a first silicon film of a second conductivity type. A second dual-gate electrode includes a gate electrode located on a third active region and having a second silicon film of the first conductivity type and a gate electrode located on a fourth active region and having a second silicon film of the second conductivity type. At least a portion of the first silicon film of the first conductivity type has a first-conductivity-type impurity concentration higher than that of a portion of the second silicon film of the first conductivity type located on the third active region.

14 Claims, 16 Drawing Sheets

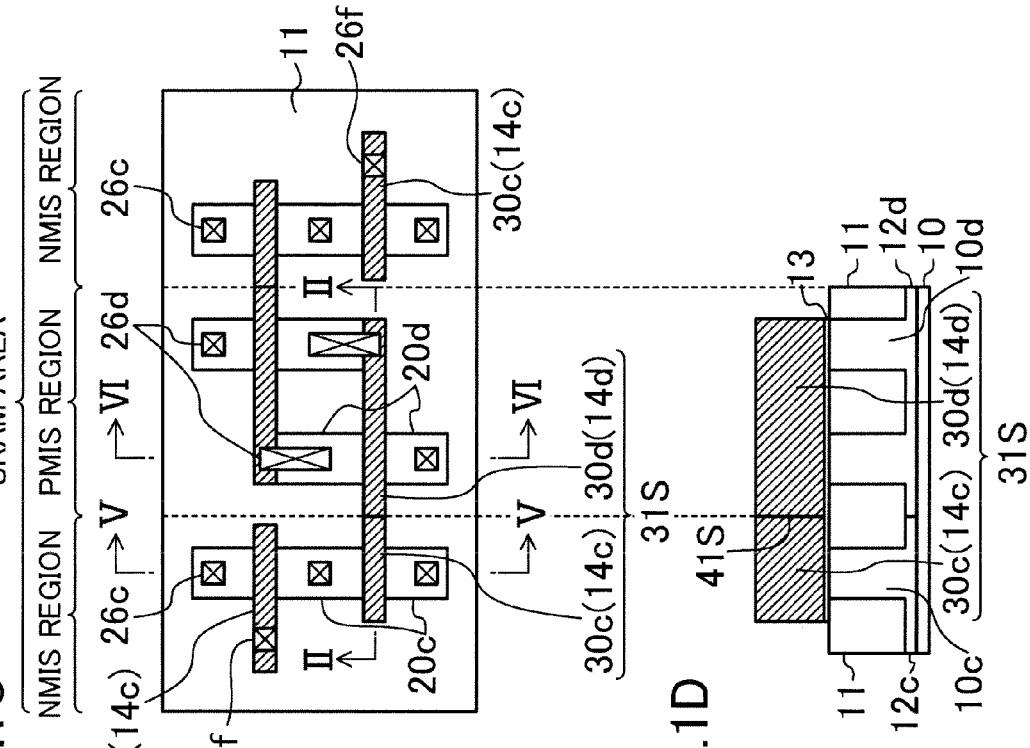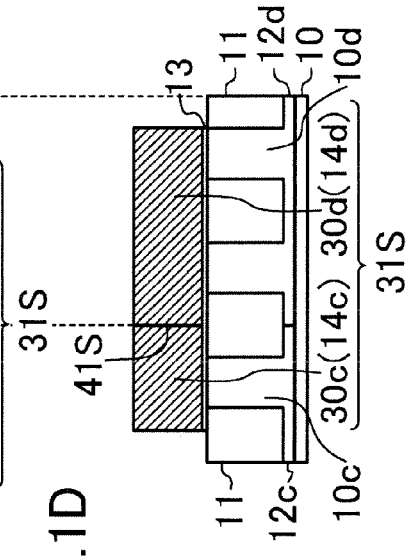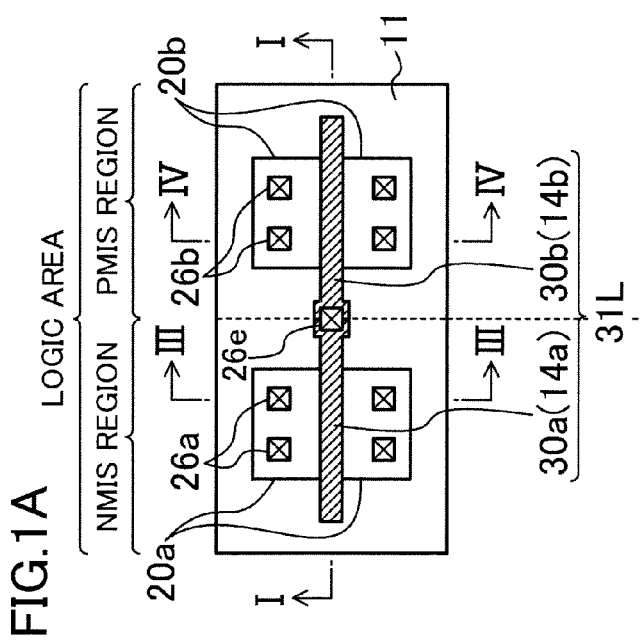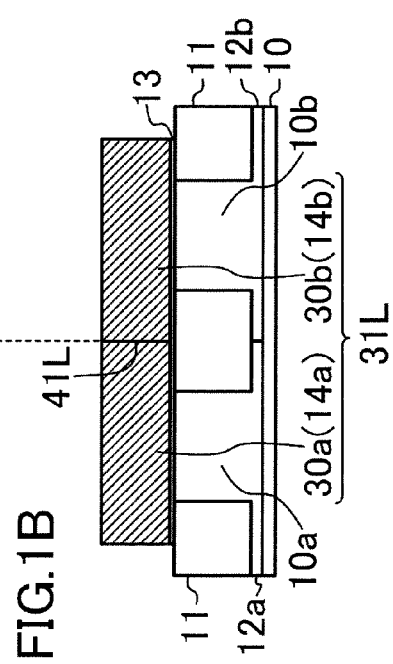

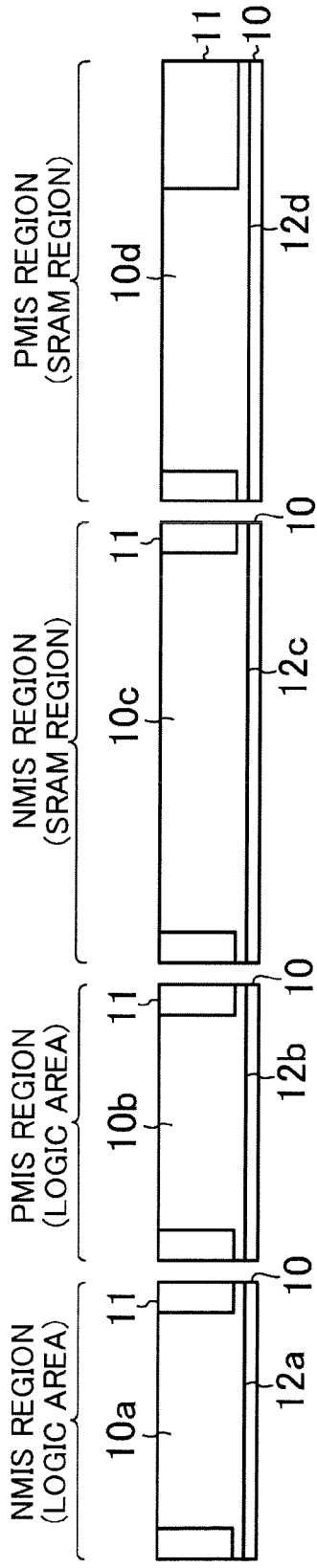
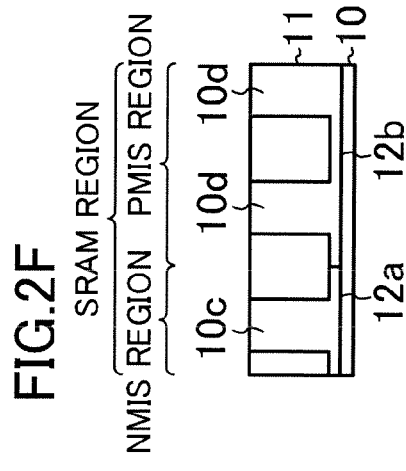
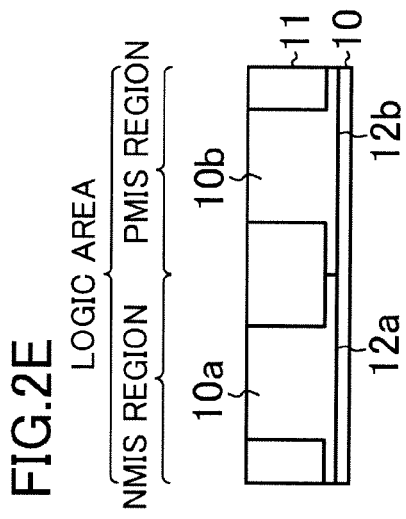

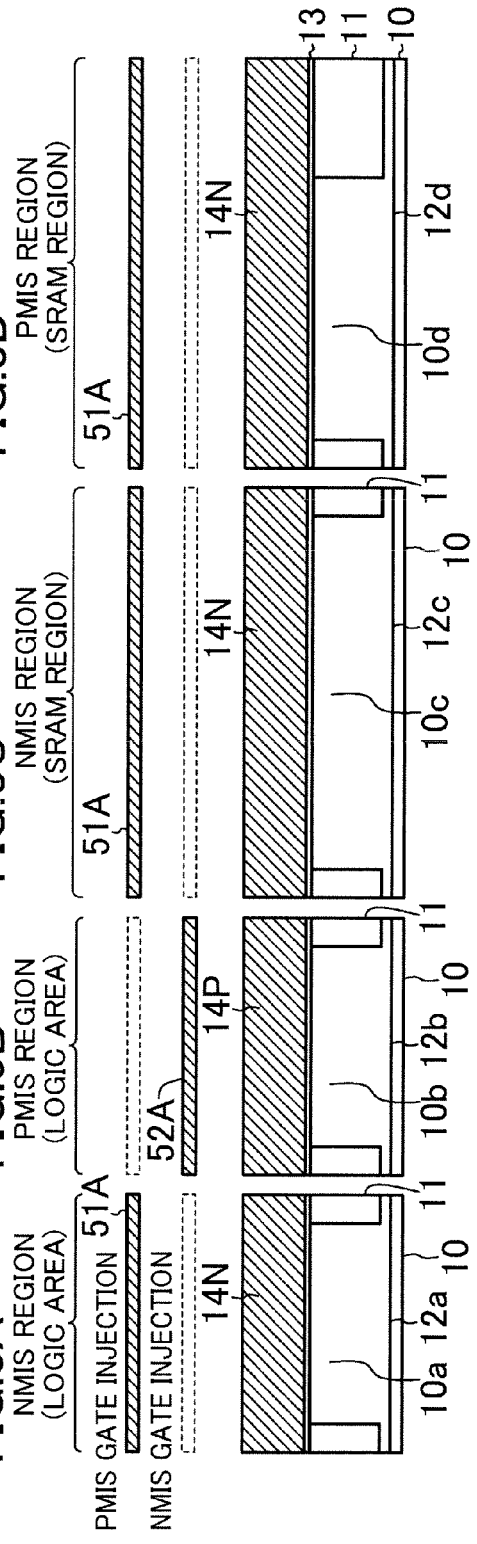

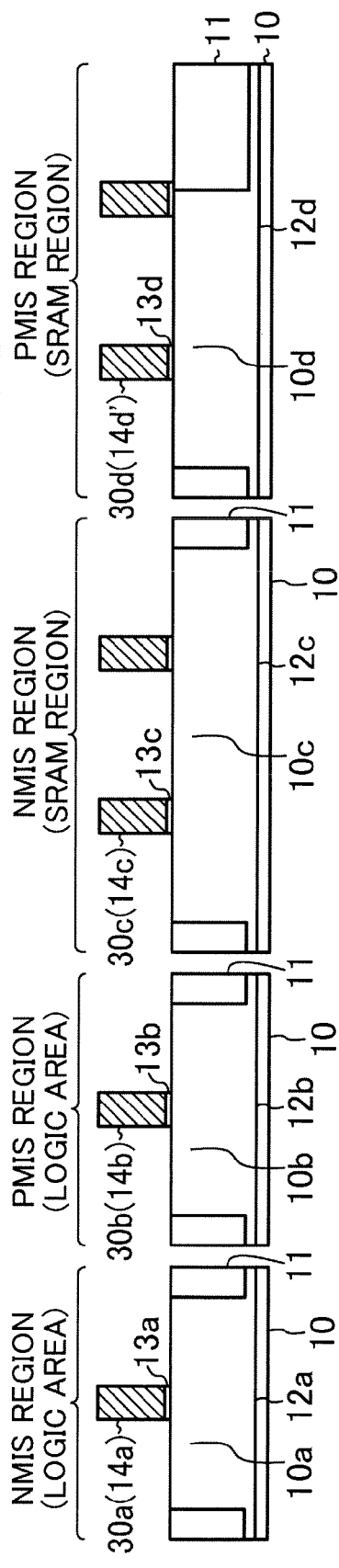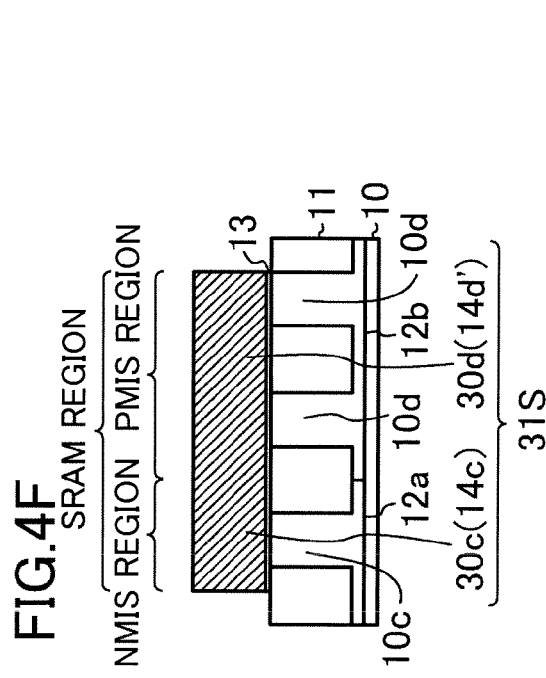

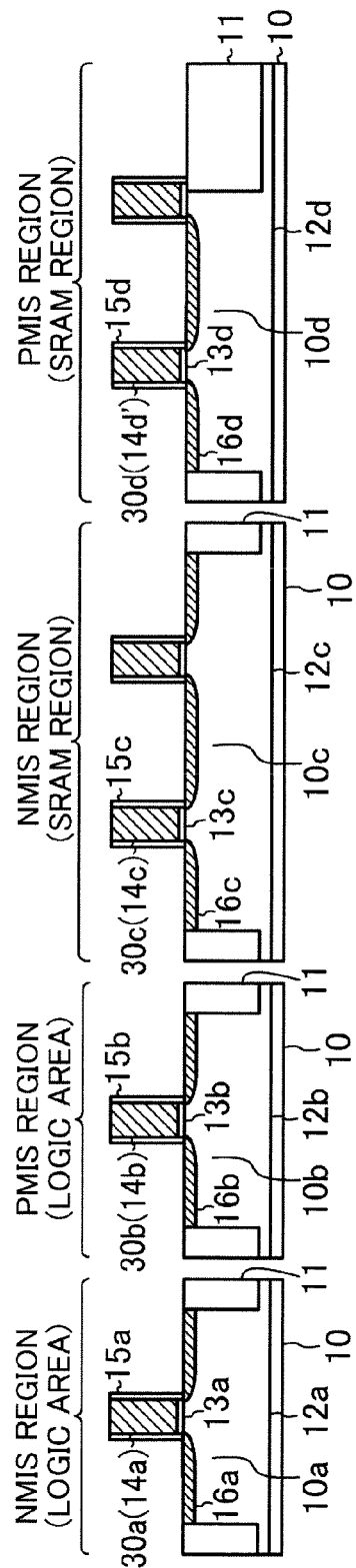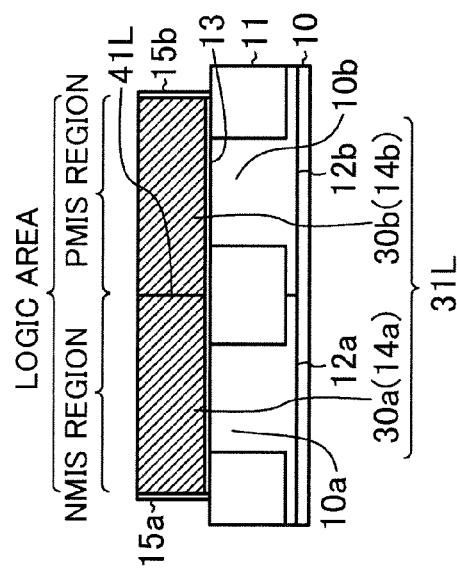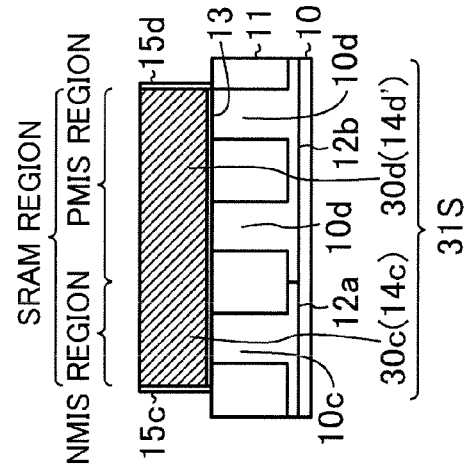

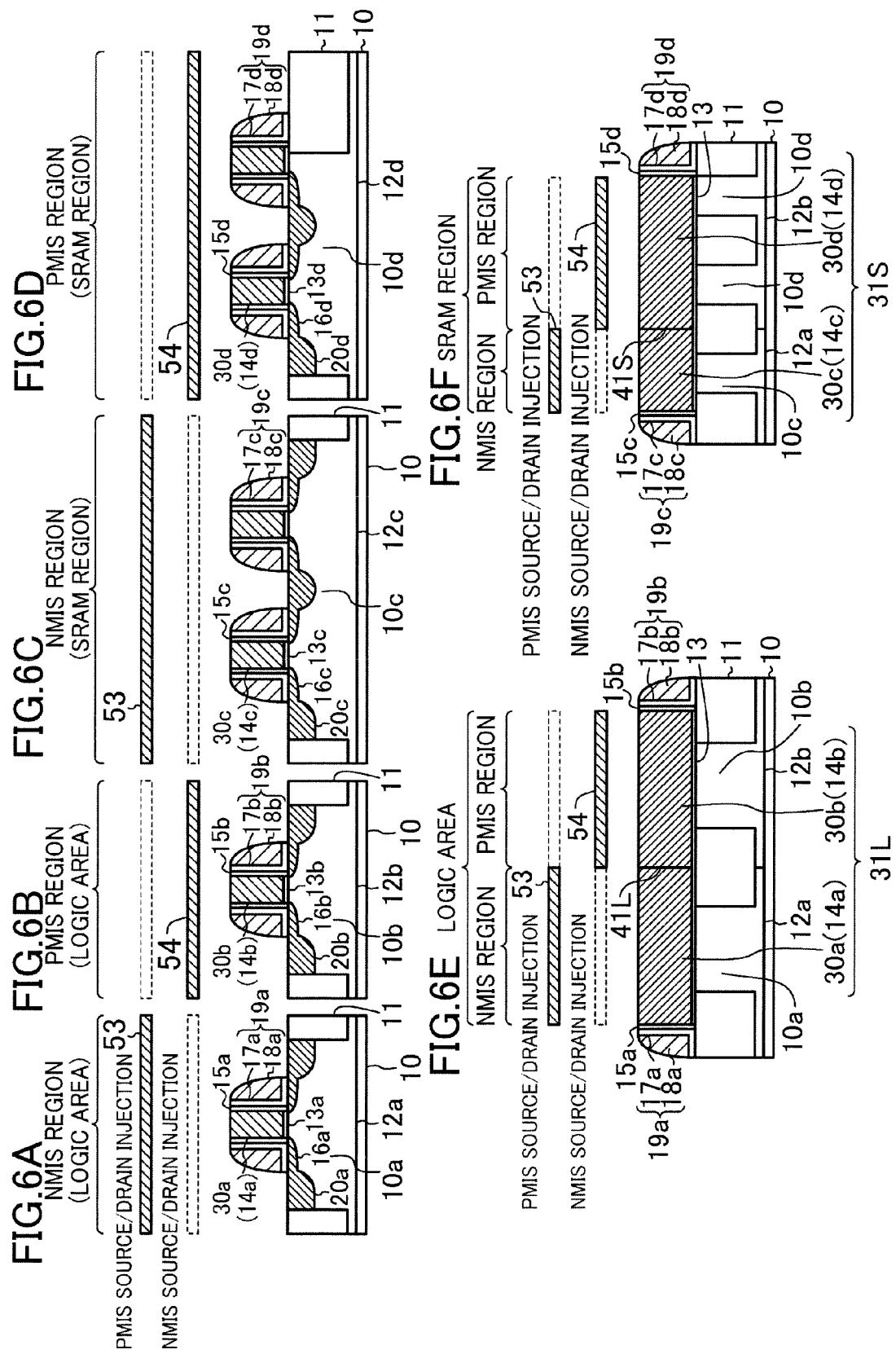

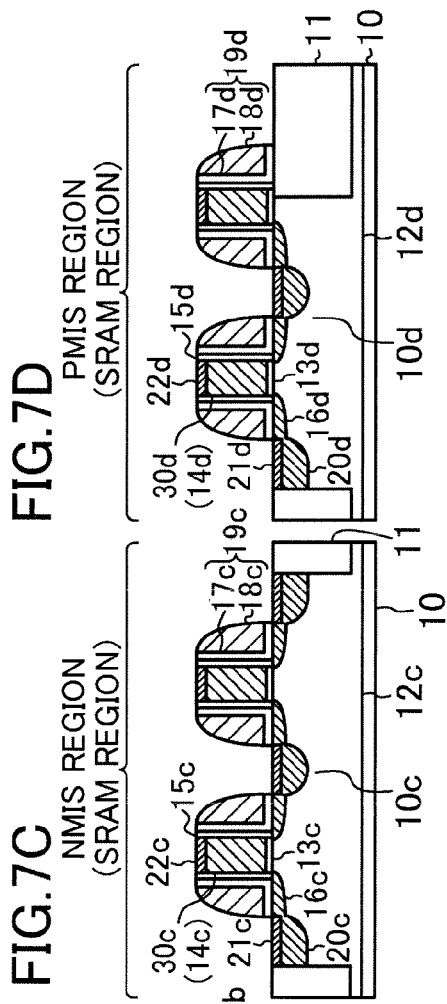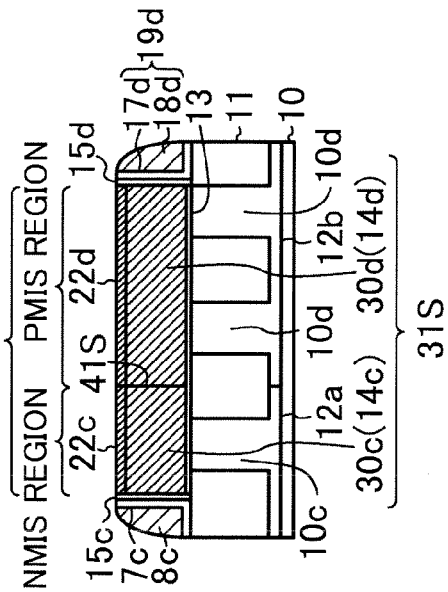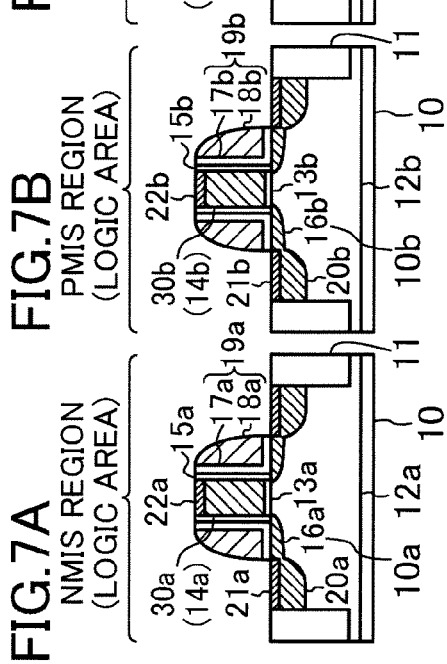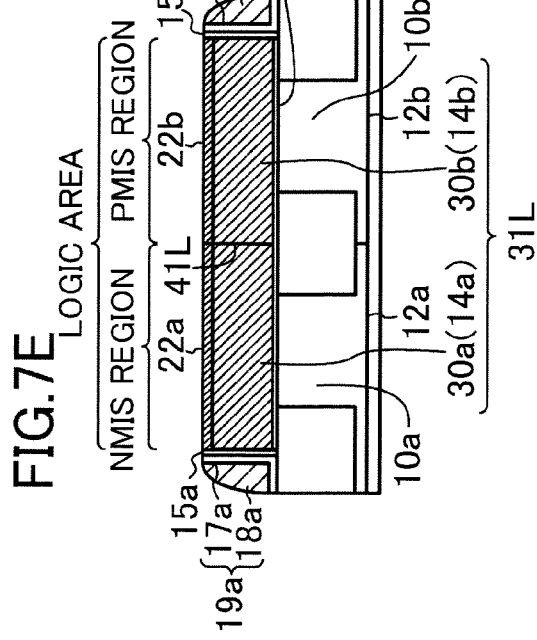

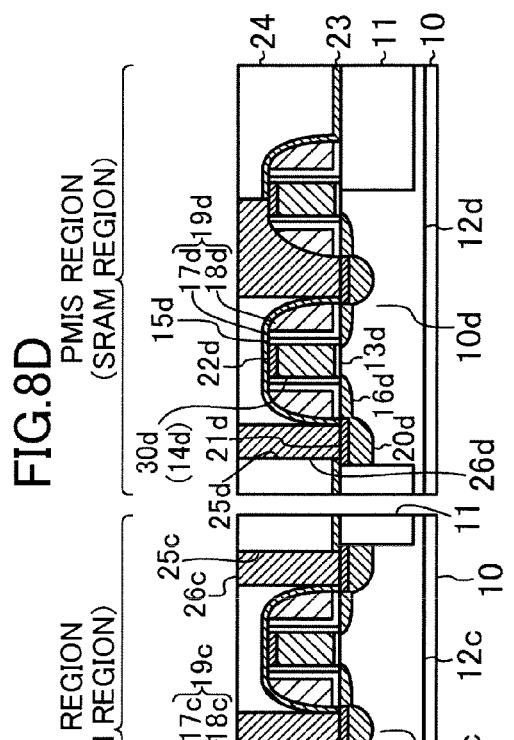
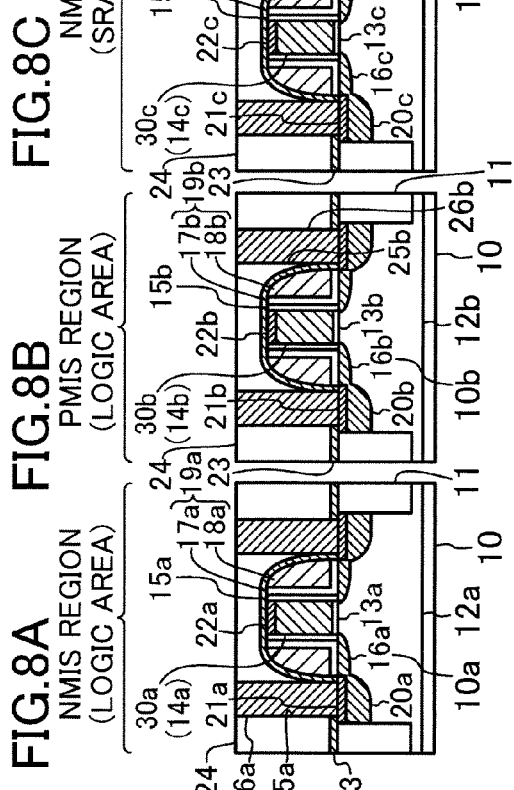
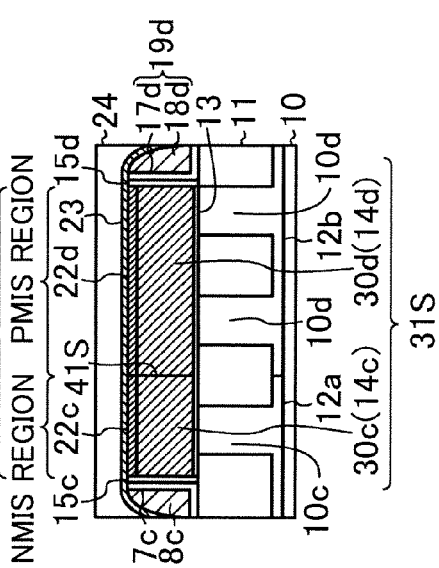
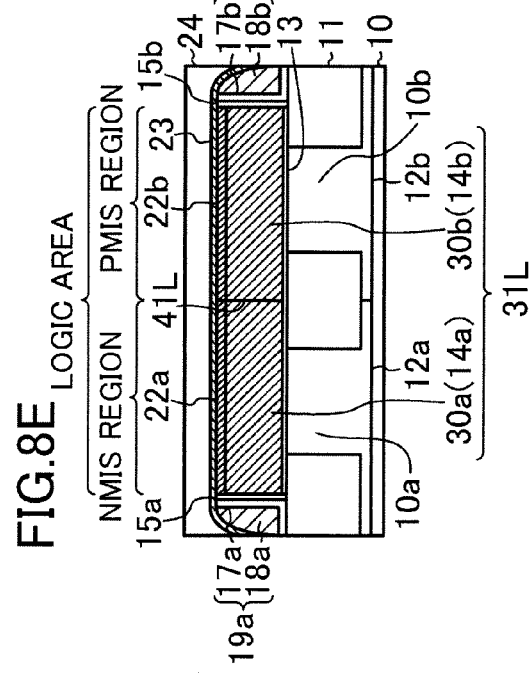

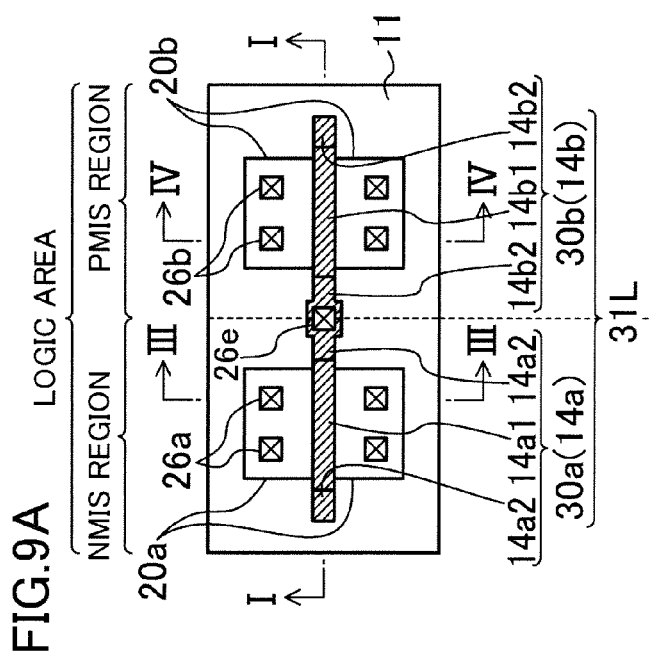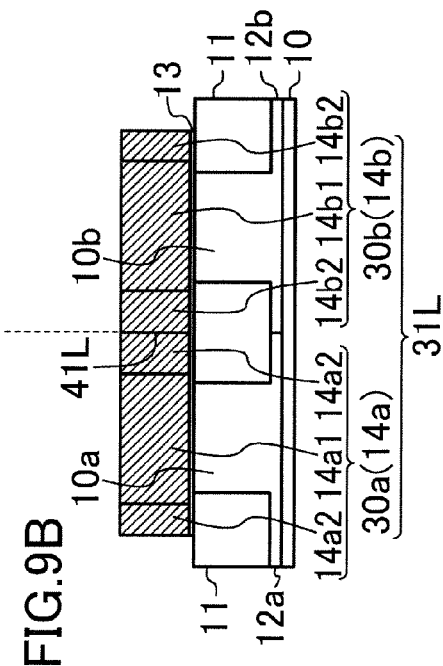
FIG.9A  FIG.9B  FIG.9C  FIG.9D

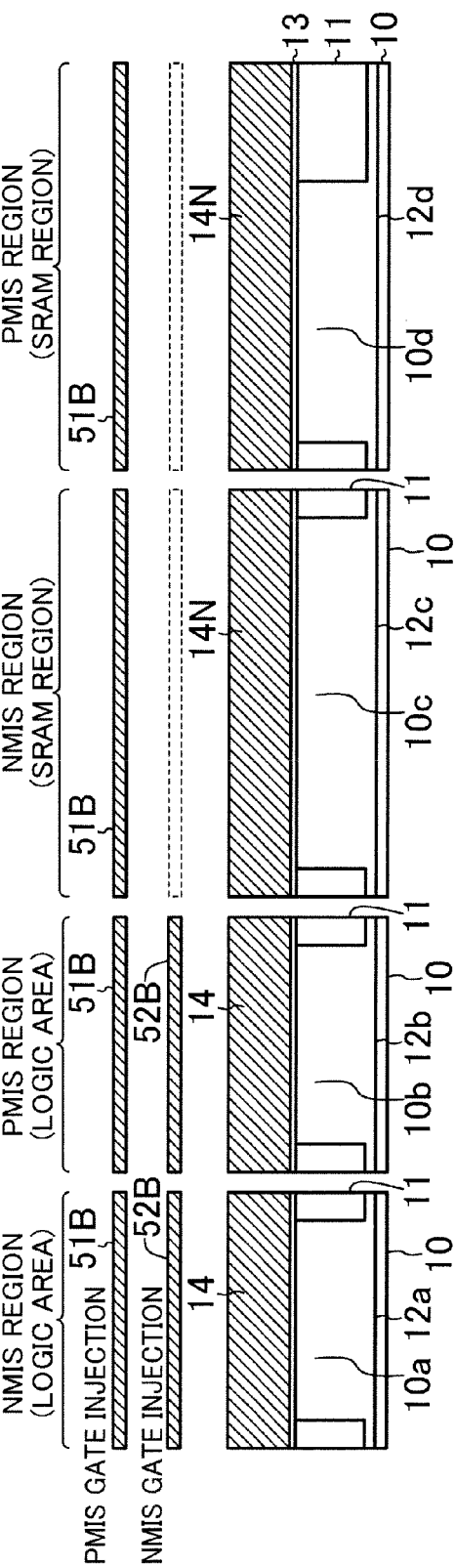

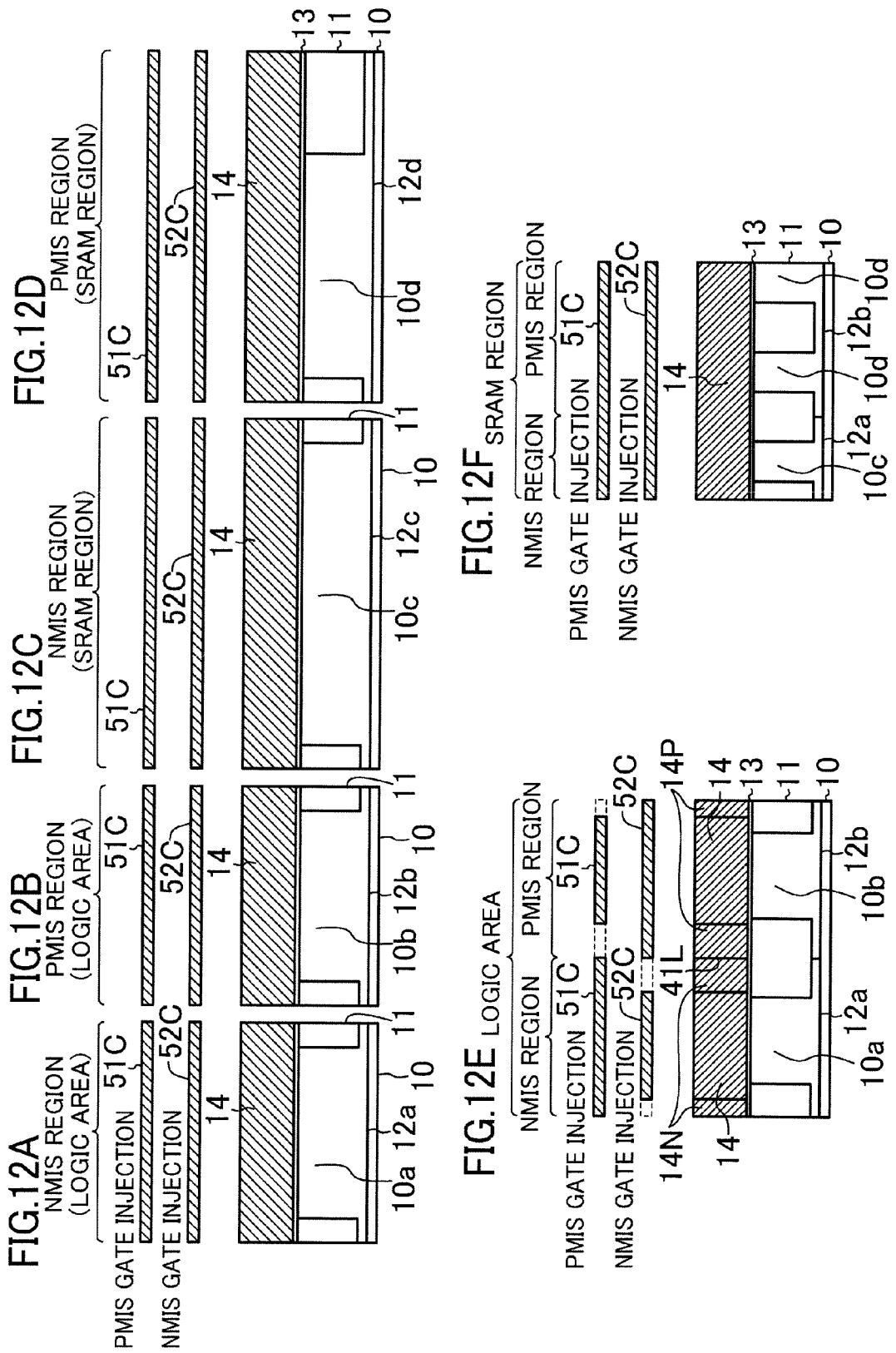

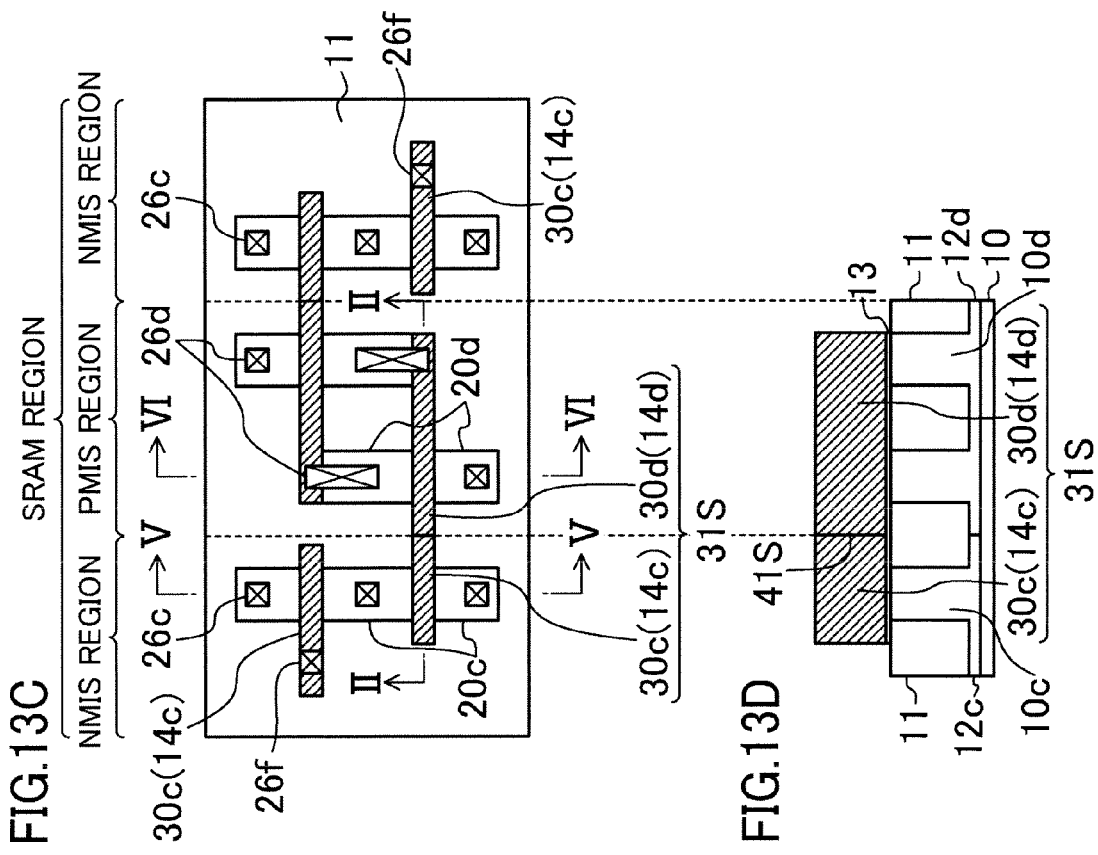
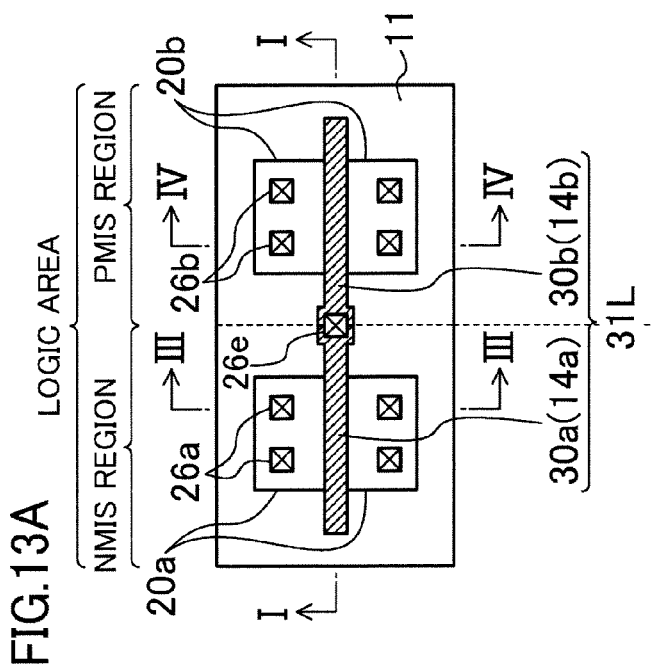
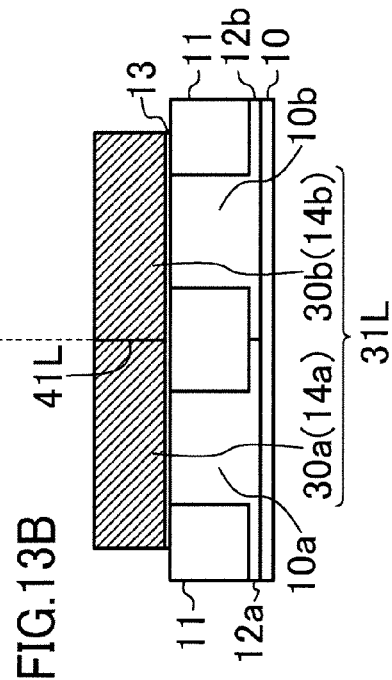

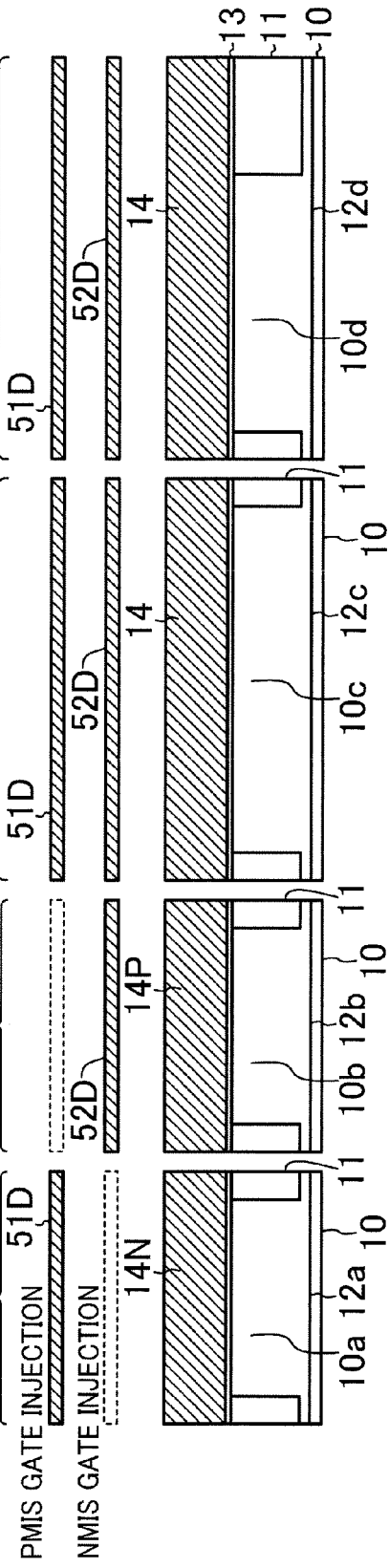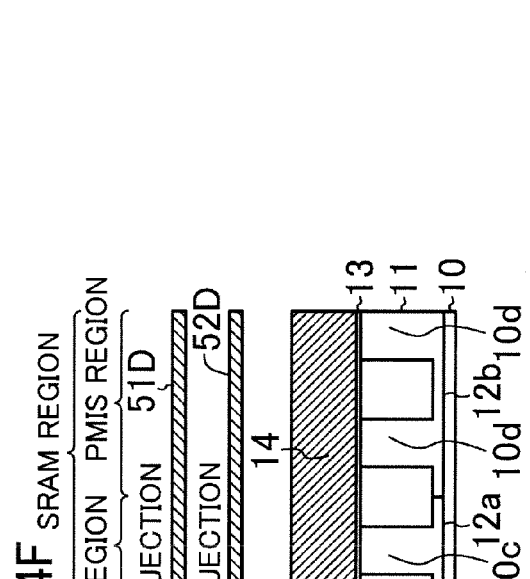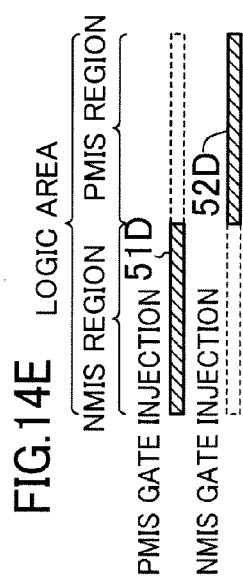

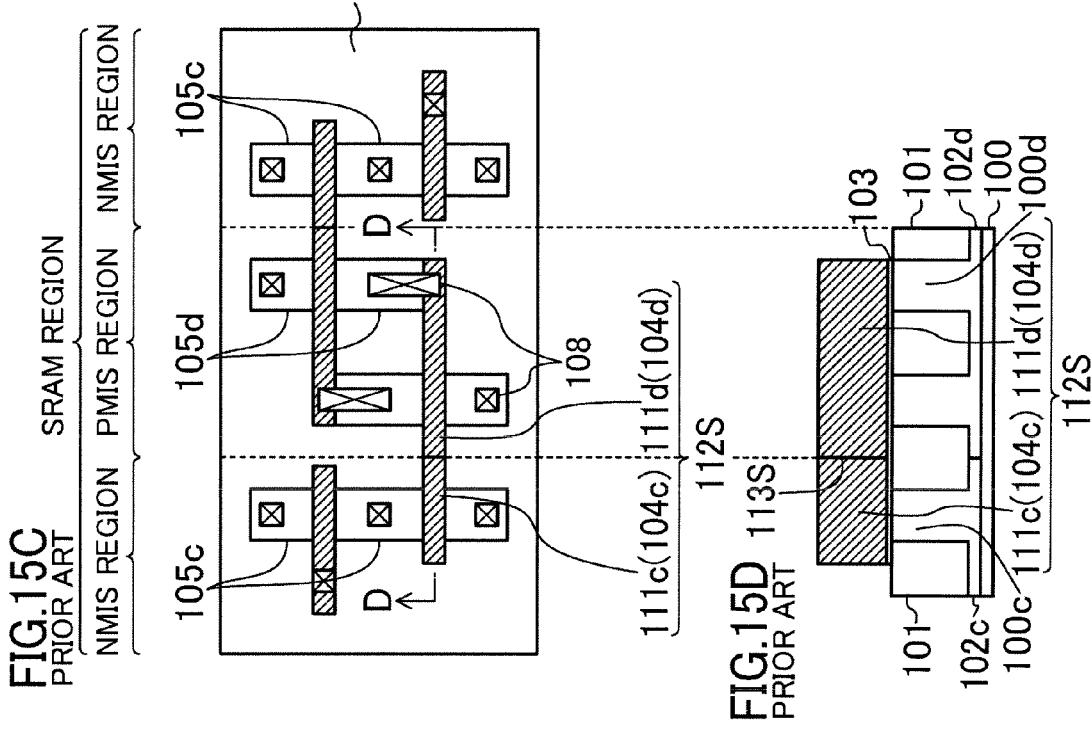
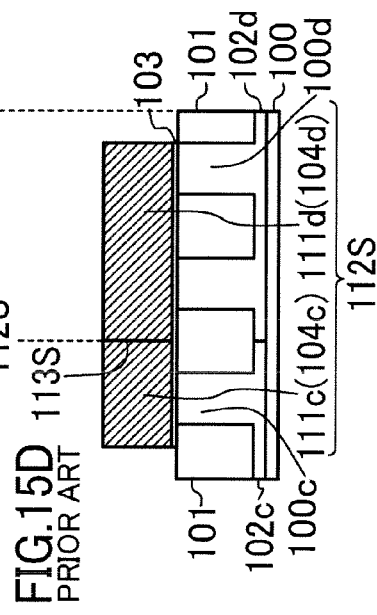
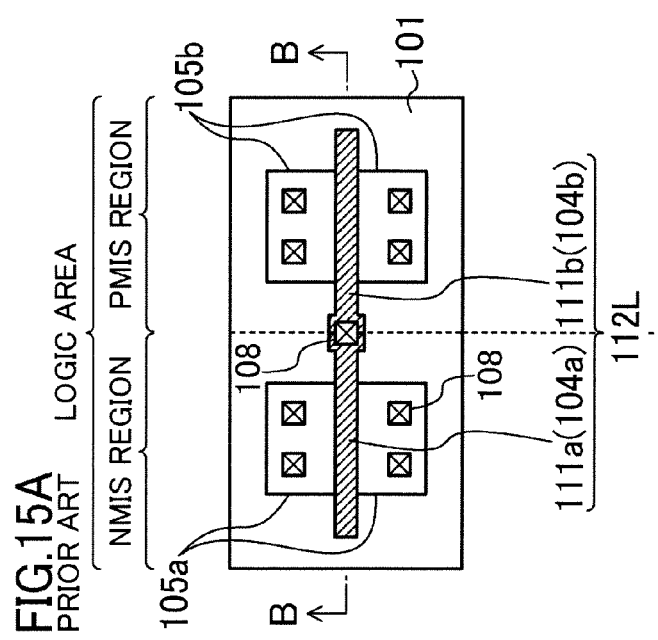
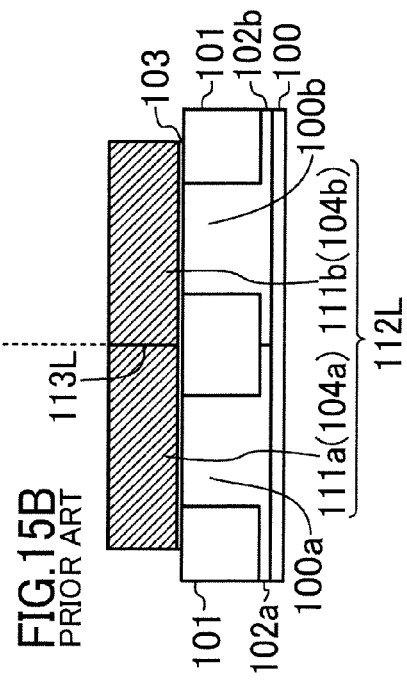

US 8,884,373 B2

SEMICONDUCTOR DEVICE

CROSS-REFERENCE TO RELATED APPLICATION

This is a continuation of PCT International Application PCT/JP2011/006167 filed on Nov. 4, 2011, which claims priority to Japanese Patent Application No. 2011-068131 filed on Mar. 25, 2011. The disclosures of these applications including the specifications, the drawings, and the claims are hereby incorporated by reference in their entirety.

BACKGROUND

The present disclosure relates to semiconductor devices and methods for fabricating semiconductor devices, and more particularly to a semiconductor device having a complementary metal insulator semiconductor (CMIS) dual-gate structure and a method for fabricating such a semiconductor device.

The integration degree of semiconductor integrated circuits have been increased by miniaturizing CMIS devices with dual-gate structures. A CMIS device with a dual-gate structure generally refers to a device including a polysilicon film doped with an n-type impurity as a gate electrode of an n-channel metal insulator semiconductor field effect transistor (hereinafter referred to as an NMISFET) and also including a polysilicon film doped with a p-type impurity as a gate electrode of a p-channel MISFET (hereinafter referred to as a PMISFET) (see, for example, Japanese Patent Publication No. H06-275788). In a CMIS device with a dual-gate structure, a metal silicide layer is formed on a polysilicon gate electrode in order to connect an n-type polysilicon gate electrode and a p-type polysilicon gate electrode. In this structure, in the boundary between an n-type region and a p-type region in each of the polysilicon gate electrode, impurities in these regions are diffused from one region to the other through the metal silicide layer or the polysilicon film, resulting in a change in work function of the gate electrode, and thus, a variation in threshold voltage of each of the FETs.

As a conventional method for forming an n-type region and a p-type region in a polysilicon film for gate electrodes, ions of impurities are implanted into the polysilicon film for gate electrodes using a mask designed such that the boundary between the n-type region and the p-type region is located on an isolation between well regions (see, for example, Japanese Patent Publication No. H08-17934).

A conventional semiconductor device in which an n-type region and a p-type region are formed by implanting ions into gate electrodes of a transistor for a logic circuit and a transistor for a static random access memory (SRAM) circuit will be described with reference to the drawings.

FIG. 15A is a plan view illustrating a logic area of a conventional semiconductor device. FIG. 15B is a cross-sectional view taken along the line B-B (along the gate width) in FIG. 15A. FIG. 15C is a plan view illustrating an SRAM area of the conventional semiconductor device. FIG. 15D is a cross-sectional view taken along the line D-D (along the gate width) in FIG. 15C. In FIGS. 15A-15D, sidewall spacers, a silicide layer, and an interlayer film, for example, are not shown for simplicity, and contacts are not shown in FIGS. 15B and 15D.

As illustrated in FIGS. 15A-15D, each of the logic area and the SRAM area of the conventional semiconductor device has an NMIS region and a PMIS region. In the NMIS region in the logic area, a p-well region 102a is provided on a semiconductor substrate 100 and an active region 100a is surrounded by an isolation region 101. In the PMIS region in the logic area, an n-well region 102b is provided on the semiconductor substrate 100 and an active region 100b is surrounded by the isolation region 101. In the NMIS region in the SRAM area, a p-well region 102c is provided on the semiconductor substrate 100, and an active region 100c is surrounded by the isolation region 101. In the PMIS region in the SRAM area, an n-well region 102d is provided on the semiconductor substrate 100, and an active region 100d is surrounded by the isolation region 101.

On the active region 100a, a gate electrode 111a including an n-type polysilicon film 104a is formed with a gate insulating film 103 interposed therebetween. On the active region 100b, a gate electrode 111b including a p-type polysilicon film 104b is formed with the gate insulating film 103 interposed therebetween. The gate electrode 111a and the gate electrode 111b are connected to each other at a PN boundary 113L between the active region 100a and the active region 100b on the isolation region 101, thereby forming a dual-gate electrode 112L. N-type source/drain regions 105a are defined at both sides of the gate electrode 111a in the active region 100a. P-type source/drain regions 105b are defined at both sides of the gate electrode 111b in the active region 100b. A contact 108 is formed to be connected to the dual-gate electrode 112L, the n-type source/drain regions 105a, and the p-type source/drain regions 105b.

On the active region 100c, a gate electrode 111c including an n-type polysilicon film 104c is formed with the gate insulating film 103 interposed therebetween. On the active region 100d, a gate electrode 111d including a p-type polysilicon film 104d is formed with gate insulating film 103 interposed therebetween. The gate electrode 111c and the gate electrode 111d are connected to each other at a PN boundary 113S between the active region 100c and the active region 100d on the isolation region 101, thereby forming a dual-gate electrode 112S. N-type source/drain regions 105c are defined at both sides of the gate electrode 111c in the active region 100c. P-type source/drain regions 105d are defined at both sides of the gate electrode 111d in the active region 100d. A contact 108 is formed to be connected to the dual-gate electrode 112S, the n-type source/drain regions 105c, and the p-type source/drain regions 105d.

FIGS. 16A and 16B are views schematically illustrating formation of a p-type region and an n-type region by implanting ions of impurities into a polysilicon film (before gate patterning) to be dual-gate electrodes 112L and 112S. In FIGS. 16A and 16B, components already shown in FIGS. 15A-15D are denoted by the same reference characters.

As illustrated in FIGS. 16A and 16B, in gate injection for the PMIS regions, ions of a p-type impurity are implanted into the polysilicon film 104 using a mask pattern 151 covering the NMIS region in each of the logic area and the SRAM area, thereby forming p-type polysilicon films 104b and 104d. That is, the p-type polysilicon films 104b and 104d have substantially the same concentration of the p-type impurity. In gate injection for the NMIS regions, ions of an n-type impurity are implanted into the polysilicon film 104 using a mask pattern 152 covering the PMIS region of each of the logic area and the SRAM area, thereby forming n-type polysilicon films 104a and 104c. That is, the n-type polysilicon films 104a and 104c have substantially the same concentration of the n-type impurity. For simplicity, not resist patterns actually employed in ion implantation but mask patterns on photomasks for forming the resist patterns are schematically shown as the mask patterns 151 and 152. The mask patterns 151 and 152 are designed such that the PN boundaries formed in the polysilicon film 104 are located between the active region 100a and the active region 100*b* and between the active region 100*c* and the active region 100*d*, respectively, on the isolation region 101.

Although not shown, in ion implantation for forming source/drain regions in each of the PMIS region and the NMIS region, mask patterns similar to the mask patterns 151 and 152 shown in FIGS. 16A and 16B are used.

In the gate injection illustrated in FIGS. 16A and 16B, the PN boundary formed in the polysilicon film 104 is located on a portion of the isolation region between the active regions. Thus, it is possible to reduce degradation of characteristics of FETs due to mutual diffusion of impurities between the n-type region and the p-type region in the polysilicon gate electrode.

SUMMARY

However, as the gate length decreases with miniaturization of devices, there arises the following problem in addition to the problem of mutual diffusion in the polysilicon film. Specifically, the difference in the etching speed of the polysilicon film between different types of ions serving as dopants relatively increases, thereby causing a variation in final gate length, and as a result, a variation in the threshold voltages of transistors arises. To solve the problem, especially in devices such as SRAMs which need to have their cell sizes reduced, it is necessary to reduce a variation in gate dimensions occurring near a PN boundary.

In addition, as in the conventional method described above, even if the PN boundary in the polysilicon gate electrode is located on a portion of the isolation region between the active regions, a small width of the isolation region especially in a device such as an SRAM makes the influence of mutual diffusion of impurities between the n-type region and the p-type region in the polysilicon gate electrode nonnegligible. Consequently, a variation occurs in the work functions of the gate electrodes to deteriorate transistor characteristics such as a variation in threshold voltage. As a result, failures in circuit operation often occurs.

It is therefore an object of the present disclosure to reduce a variation in transistor characteristics due to a variation in gate dimensions near a PN boundary and mutual diffusion of impurities in a semiconductor device with a CMIS dual-gate structure.

To achieve the object, a semiconductor device in an aspect of the present disclosure includes: a first dual-gate electrode; and a second dual-gate electrode, wherein the first dual-gate electrode includes a first gate electrode located on a first active region and having a first silicon film of a first conductivity type and a second gate electrode located on a second active region and having a first silicon film of a second conductivity type, the second dual-gate electrode includes a third gate electrode located on a third active region and having a second silicon film of the first conductivity type and a fourth gate electrode located on a fourth active region and having a second silicon film of the second conductivity type, the first active region and the second active region are isolated from each other with an isolation region interposed therebetween, the first gate electrode and the second gate electrode are connected to each other on the isolation region, and at least a portion of the first silicon film of the first conductivity type has a first-conductivity-type impurity concentration higher than that of a portion of the second silicon film of the first conductivity type located on the third active region.

In the semiconductor device, an isolation width between the first active region and the second active region may be larger than that between the third active region and the fourth active region.

In the semiconductor device, at least a portion of the first silicon film of the second conductivity type may have a second-conductivity-type impurity concentration substantially equal to that of a portion of the second silicon film of the second conductivity type located on the fourth active region.

In the semiconductor device, a portion of the first silicon film of the first conductivity type located on the first active region may have a first-conductivity-type impurity concentration higher than that of a portion of the second silicon film of the first conductivity type located on the third active region.

In the semiconductor device, a portion of the first silicon film of the first conductivity type located on the first active region may have a first-conductivity-type impurity concentration lower than that of a portion of the first silicon film of the first conductivity type located on the isolation region.

In the semiconductor device, a portion of the first silicon film of the first conductivity type located on each of the first active region and the isolation region may have a first-conductivity-type impurity concentration higher than that of a portion of the second silicon film of the first conductivity type located on the third active region.

In the semiconductor device, a portion of the first silicon film of the second conductivity type located on the second active region may have a second-conductivity-type impurity concentration lower than that of a portion of the second silicon film of the second conductivity type located on the fourth active region.

In the semiconductor device, a portion of the first silicon film of the second conductivity type located on the second active region may have a second-conductivity-type impurity concentration lower than that of a portion of the first silicon film of the second conductivity type located on the isolation region.

In the semiconductor device, a portion of the first silicon film of the second conductivity type located on the isolation region may have a second-conductivity-type impurity concentration substantially equal to that of a portion of the second silicon film of the second conductivity type located on the fourth active region.

In the semiconductor device, a portion of the first silicon film of the first conductivity type located on the first active region may have a first-conductivity-type impurity concentration substantially equal to that of a portion of the first silicon film of the first conductivity type located on the isolation region.

In the semiconductor device, a portion of the first silicon film of the first conductivity type located on the isolation region may have a first-conductivity-type impurity concentration higher than that of a portion of the second silicon film of the first conductivity type located on the third active region.

In the semiconductor device, a portion of the first silicon film of the first conductivity type located on the first active region may have a first-conductivity-type impurity concentration substantially equal to that of a portion of the second silicon film of the first conductivity type located on the third active region.

In the semiconductor device, a portion of the first silicon film of the first conductivity type located on the first active region may have a first-conductivity-type impurity concentration lower than that of a portion of the first silicon film of the first conductivity type located on the isolation region.

In the semiconductor device, a portion of the first silicon film of the second conductivity type located on the second active region may have a second-conductivity-type impurity concentration substantially equal to that of a portion of the second silicon film of the second conductivity type located on the fourth active region.

In the semiconductor device, a portion of the first silicon film of the second conductivity type located on the second active region may have a second-conductivity-type impurity concentration lower than that of a portion of the first silicon film of the second conductivity type located on the isolation region.

In the semiconductor device, a portion of the first silicon film of the second conductivity type located on the isolation region may have a second-conductivity-type impurity concentration higher than that of a portion of the second silicon film of the second conductivity type located on the fourth active region.

In the semiconductor device, a portion of the first silicon film of the first conductivity type located on the first active region may have a first-conductivity-type impurity concentration higher than that of a portion of the second silicon film of the first conductivity type located on the third active region, and a portion of the first silicon film of the second conductivity type located on the second active region may have a second-conductivity-type impurity concentration higher than that of a portion of the second silicon film of the second conductivity type located on the fourth active region.

In the semiconductor device, the first gate electrode may be a gate electrode of a first PMIS transistor, the second gate electrode may be a gate electrode of a first NMIS transistor, the third gate electrode may be a gate electrode of a second PMIS transistor, and the fourth gate electrode may be a gate electrode of a second NMIS transistor.

In the semiconductor device, each of the first gate electrode and the second gate electrode may be a gate electrode of a transistor for a logic circuit, and each of the third gate electrode and the fourth gate electrode may be a gate electrode of a transistor for an SRAM circuit.

A method for fabricating a semiconductor device in an aspect of the present disclosure is a method for forming a semiconductor device including a first dual-gate electrode including a first gate electrode located on a first active region and a second gate electrode located on a second active region and a second dual-gate electrode including a third gate electrode located on a third active region and a fourth gate electrode located on a fourth active region. The method for fabricating a semiconductor device includes the steps of: (a) forming a silicon film on the first active region, the second active region, the third active region, and the fourth active region; (b) introducing an impurity of a first conductivity type into the silicon film with portions of the silicon film located on the second active region, the third active region, and the fourth active region being covered with a first mask pattern; (c) introducing an impurity of a second conductivity type with a portion of the silicon film located on the first active region being covered with a second mask pattern; and (d) patterning the silicon film after steps (b) and (c), thereby forming the first gate electrode, the second gate electrode, the third gate electrode, and the fourth gate electrode including the silicon film on the first active region, the second active region, the third active region, and the fourth active region, respectively. In the method for fabricating a semiconductor device, step (b) and step (c) may be performed in any order.

In the method for fabricating a semiconductor device, the first mask pattern may expose a portion of the silicon film located on the first active region, and the second mask pattern may expose portions of the silicon film located on the second active region, the third active region, and the fourth active region.

In the method for fabricating a semiconductor device, the first active region and the second active region are electrically isolated from each other by an isolation region. In step (a), the silicon film may also be formed on the isolation region, the first mask pattern may cover a portion of the silicon film located on the first active region and expose a portion of the silicon film located on the isolation region, and the second mask pattern may cover a portion of the silicon film located on the second active region and expose portions of the silicon film located on the isolation region, the third active region, and the fourth active region. The first mask pattern and the second mask pattern do not need to expose a portion of the silicon film located on the isolation region. In other words, the first mask pattern and the second mask pattern may cover a portion of the silicon film located on the isolation region.

In the method for fabricating a semiconductor device, the first active region and the second active region may be electrically isolated from each other by an isolation region. In step (a), the silicon film may also be formed on the isolation region, the first mask pattern may cover a portion of the silicon film located on the first active region and expose a portion of the silicon film located on the isolation region, and the second mask pattern may cover portions of the silicon film located on the second active region, the third active region, and the fourth active region and expose a portion of the silicon film located on the isolation region.

In the method for fabricating a semiconductor device, the second mask pattern may cover portions of the silicon film located on the third active region and the fourth active region.

According to the present disclosure described above, it is possible to reduce a variation in transistor characteristics due to a variation in gate dimensions near a PN boundary and mutual diffusion of impurities in a semiconductor device with a CMIS dual-gate structure. Thus, the present disclosure is useful for semiconductor devices with CMIS dual-gate structures and methods for fabricating such semiconductor devices.

BRIEF DESCRIPTION OF THE DRAWINGS

FIG. 1A is a plan view illustrating a logic area of a semiconductor device according to a first embodiment, FIG. 1B is a cross-sectional view taken along the line I-I in FIG. 1A, FIG. 1C is a plan view illustrating an SRAM area of the semiconductor device of the first embodiment, and FIG. 1D is a cross-sectional view taken along the line II-II in FIG. 1C.

FIGS. 2A-2F are cross-sectional views showing a process step of a method for fabricating a semiconductor device according to the first embodiment.

FIGS. 3A-3F are cross-sectional views showing a process step of the method for fabricating a semiconductor device of the first embodiment.

FIGS. 4A-4F are cross-sectional views showing a process step of the method for fabricating a semiconductor device of the first embodiment.

FIGS. 5A-5F are cross-sectional views showing a process step of the method for fabricating a semiconductor device of the first embodiment.

FIGS. 6A-6F are cross-sectional views showing a process step of the method for fabricating a semiconductor device of the first embodiment.

FIGS. 7A-7F are cross-sectional views showing a process step of the method for fabricating a semiconductor device of the first embodiment.

FIGS. 8A-8F are cross-sectional views showing a process step of the method for fabricating a semiconductor device of the first embodiment.

FIG. 9A is a plan view illustrating a logic area of a semiconductor device according to a second embodiment, FIG. 9B is a cross-sectional view taken along the line I-I in FIG. 9A, FIG. 9C is a plan view illustrating an SRAM area of the semiconductor device of the second embodiment, and FIG. 9D is a cross-sectional view taken along the line II-II in FIG. 9C.

FIGS. 10A-10F are cross-sectional views showing a process step of a method for fabricating a semiconductor device according to the second embodiment.

Figures 11A, 11B, 11C, 11D:
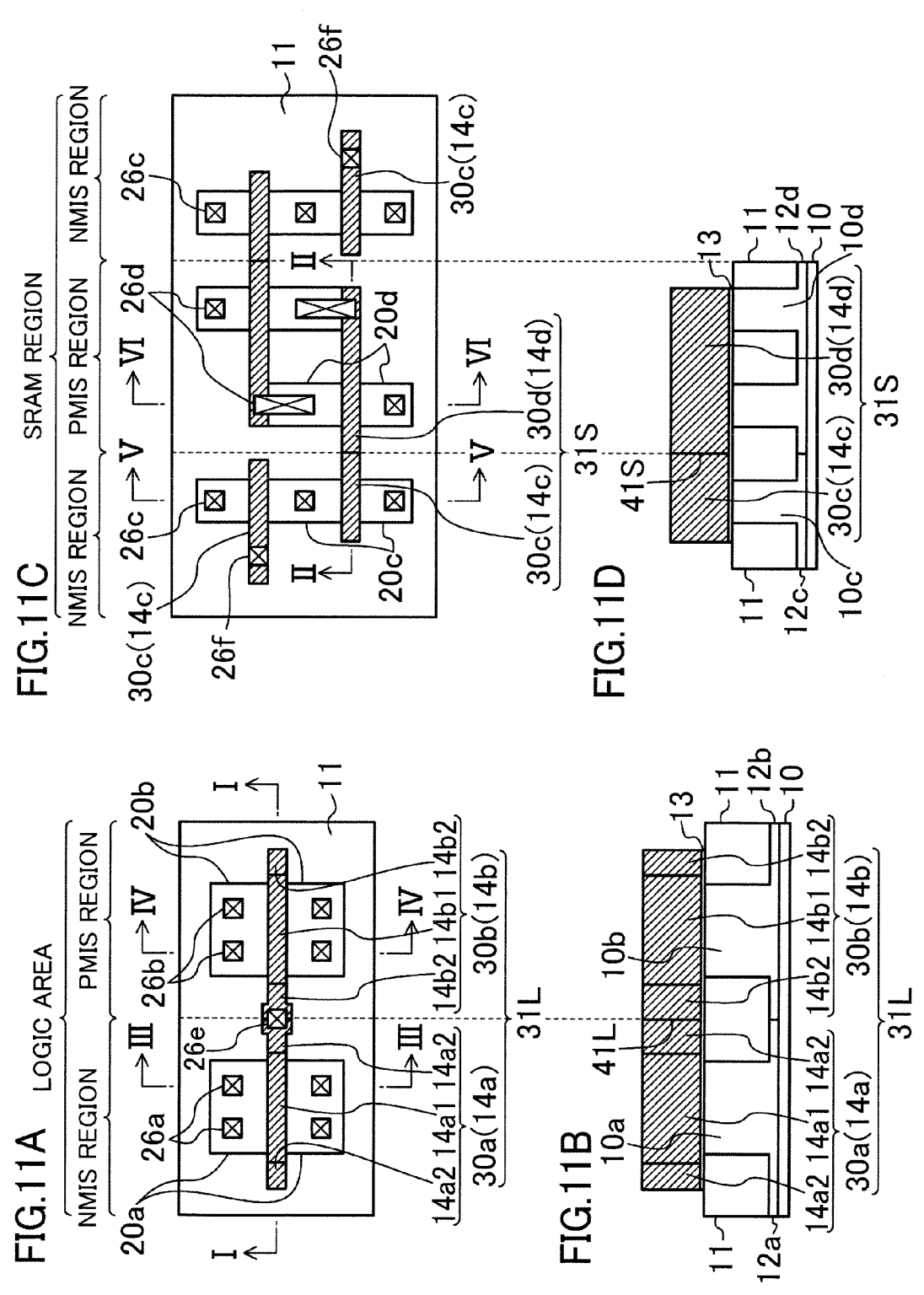

FIG. 11A is a plan view illustrating a logic area of a semiconductor device according to a third embodiment, FIG. 11B is a cross-sectional view taken along the line I-I in FIG. 11A, FIG. 11C is a plan view illustrating an SRAM area of the semiconductor device of the third embodiment, and FIG. 11D is a cross-sectional view taken along the line II-II in FIG. 11C.

FIGS. 12A-12F are cross-sectional views showing a process step of a method for fabricating a semiconductor device according to the third embodiment.

FIG. 13A is a plan view illustrating a logic area of a semiconductor device according to a fourth embodiment, FIG. 13B is a cross-sectional view taken along the line I-I in FIG. 13A, FIG. 13C is a plan view illustrating an SRAM area of the semiconductor device of the fourth embodiment, and FIG. 13D is a cross-sectional view taken along the line II-II in FIG. 13C.

FIGS. 14A-14F are cross-sectional views showing a process step of a method for fabricating a semiconductor device according to the fourth embodiment.

FIG. 15A is a plan view illustrating a logic area of a conventional semiconductor device, FIG. 15B is a cross-sectional view taken along the line B-B in FIG. 15A, FIG. 15C is a plan view illustrating an SRAM area of the conventional semiconductor device, and FIG. 15D is a cross-sectional view taken along the line D-D in FIG. 15C.

DETAILED DESCRIPTION

First Embodiment

Figures 16A, 16B:
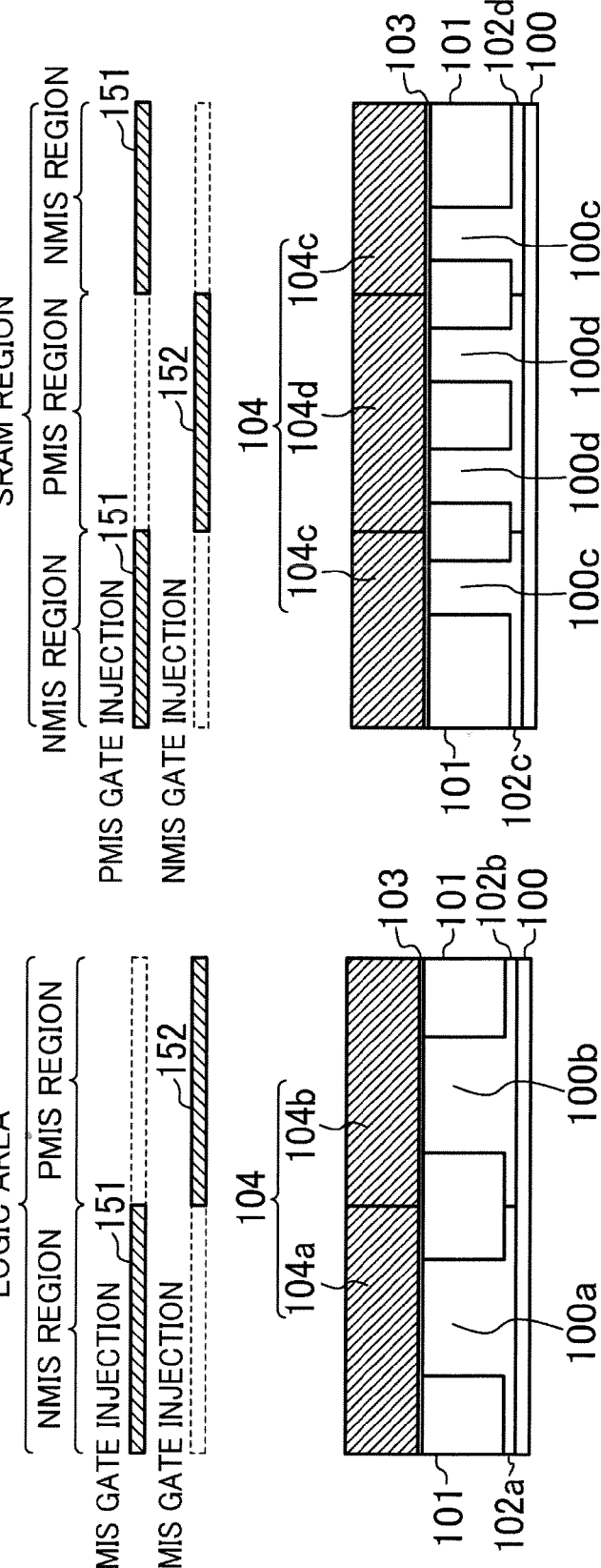
FIGS. 16A and 16B are views schematically illustrating formation of p-type regions and n-type regions by implanting ions of an impurity into a polysilicon film (before gate patterning) to be a dual-gate electrode in a conventional method for fabricating a semiconductor device.

A semiconductor device according to a first embodiment of the present disclosure will be described with reference to the drawings.

FIG. 1A is a plan view illustrating a logic area of a semiconductor device according to the first embodiment. FIG. 1B is a cross-sectional view taken along the line I-I (along the gate width) in FIG. 1A. FIG. 1C is a plan view illustrating an SRAM area of the semiconductor device of the first embodiment. FIG. 1D is a cross-sectional view taken along the line II-II (along the gate width) in FIG. 1C. In FIGS. 1A-1D, sidewall spacers, a silicide layer, and an interlayer film, for example, are not shown for simplicity, and contacts are not shown in FIGS. 1B and 1D.

As illustrated in FIGS. 1A-1D, the semiconductor device of this embodiment includes an area where a logic circuit is to be formed (hereinafter referred to as a logic area) and an area where an SRAM circuit is to be formed (hereinafter referred to as an SRAM area). Each of the logic area and the SRAM area includes a region where an NMISFET is to be formed (hereinafter referred to as an NMIS region) and a region where a PMISFET is to be formed (hereinafter referred to as a PMIS region). In the NMIS region in the logic area, a p-well region 12a is provided on a semiconductor substrate 10, and an active region 10a is surrounded by an isolation region 11. In the PMIS region in the logic area, an n-well region 12b is provided on the semiconductor substrate 10, and an active region 10b is surrounded by the isolation region 11. In the NMIS region in the SRAM area, a p-well region 12c is provided on the semiconductor substrate 10, and an active region 10c is surrounded by the isolation region 11. In the PMIS region in the SRAM area, an n-well region 12d is provided on the semiconductor substrate 10, and an active region 10d is surrounded by the isolation region 11.

On the active region 10a, a gate electrode 30a including an n-type silicon film 14a is formed with a gate insulating film 13 interposed therebetween. On the active region 10b, a gate electrode 30b including a p-type silicon film 14b is formed with the gate insulating film 13 interposed therebetween. The gate electrode 30a and the gate electrode 30b are connected to each other at a PN boundary 41L between the active region 10a and the active region 10b on the isolation region 11, thereby forming a dual-gate electrode 31L. N-type source/drain regions 20a are defined at both sides of the gate electrode 30a in the active region 10a. P-type source/drain regions 20b are defined at both sides of the gate electrode 30b in the active region 10b. Contacts 26a and 26b are formed to be connected to the n-type source/drain regions 20a and the p-type source/drain regions 20b, and a contact 26e is formed to be connected to the dual-gate electrode 31L.

On the active region 10c, a gate electrode 30c including an n-type silicon film 14c is formed with the gate insulating film 13 interposed therebetween. On the active region 10d, a gate electrode 30d including a p-type silicon film 14d is formed with the gate insulating film 13 interposed therebetween. The gate electrode 30c and the gate electrode 30d are connected to each other at a PN boundary 41S between the active region 10c and the active region 10d on the isolation region 11, thereby forming a dual-gate electrode 31S, N-type source/drain regions 20c are defined at both sides of the gate electrode 30c in the active region 10c. P-type source/drain regions 20d are defined at both sides of the gate electrode 30d in the active region 10d. Contacts 26c and 26d are formed to be connected to the n-type source/drain regions 20c and the p-type source/drain regions 20d, and a contact 26f is formed to be connected to the gate electrode 30c.

A feature of this embodiment is that the p-type impurity concentration in the entire p-type silicon film 14b is higher than that in the entire p-type silicon film 14d.

The n-type impurity concentration of the n-type silicon film 14a is substantially equal to that of the n-type silicon film 14c. The width of the isolation region 11 (specifically a portion of the isolation region 11 between the active region 10a and the active region 10b) in the logic area is, for example, about 70 nm or more, whereas the width of the isolation region 11 (specifically a portion of the isolation region 11 between the active region 10c and the active region 10d) in the SRAM area is, for example, about 30-60 nm.

A method for fabricating a semiconductor device according to the first embodiment will be described hereinafter with reference to the drawings.

FIGS. 2A-2F, 3A-3F, 4A-4F, 5A-5F, 6A-6F, 7A-7F, and 8A-8F are cross-sectional views illustrating process steps of a method for fabricating a semiconductor device according to the first embodiment. FIGS. 2A, 3A, 4A, 5A, 6A, 7A, and 8A illustrate cross-sectional structures taken along the line III-III (along the gate length) in FIG. 1A in respective process steps.

FIGS. 2B, 3B, 4B, 5B, 6B, 7B, and 8B illustrate cross-sectional structures taken along the line IV-IV (along the gate length) in FIG. 1A in the respective process steps. FIGS. 2C, 3C, 4C, 5C, 6C, 7C, and 8C illustrate cross-sectional structures taken along the line V-V (along the gate length) in FIG. 1C in the respective process steps. FIGS. 2D, 3D, 4D, 5D, 6D, 7D, and 8D illustrate cross-sectional structures taken along the line VI-VI (along the gate length) in FIG. 1C in the respective process steps. FIGS. 2E, 3E, 4E, 5E, 6E, 7E, and 8E illustrate cross-sectional structures taken along the line I-I (along the gate width) in FIG. 1A in the respective process steps. FIGS. 2F, 3F, 4F, 5F, 6F, 7F, and 8F illustrate cross-sectional structures taken along the line II-II (along the gate width) in FIG. 1C in the respective process steps.

First, as illustrated in FIGS. 2A-2F, an isolation region 11 formed by filling a trench with an insulating film is selectively formed in an upper portion of a semiconductor substrate 10 of, for example, p-type silicon by a method such as shallow trench isolation (STI). Accordingly, in the NMIS region in the logic area, an active region 10a is formed in a portion of the semiconductor substrate 10 surrounded by the isolation region 11. In the PMIS region in the logic area, an active region 10b is formed in a portion of the semiconductor substrate 10 surrounded by the isolation region 11. In the NMIS region in the SRAM area, an active region 10c is formed in a portion of the semiconductor substrate 10 surrounded by the isolation region 11. In the PMIS region in the SRAM area, an active region 10d is formed in a portion of the semiconductor substrate 10 surrounded by the isolation region 11. Thereafter, a p-type impurity such as boron (B) is implanted into each of the NMIS regions of the semiconductor substrate 10 by, for example, lithography and ion implantation. Subsequently, an n-type impurity such as phosphorus (P) is implanted into each of the PMIS regions of the semiconductor substrate 10 by, for example, lithography and ion implantation. Then, the semiconductor substrate 10 is subjected to heat treatment at 850° C. for 30 seconds, for example, thereby forming a p-well region 12a on the semiconductor substrate 10 in the NMIS region in the logic area, an n-well region 12b on the semiconductor substrate 10 in the PMIS region in the logic area, a p-well region 12c on the semiconductor substrate 10 in the NMIS region in the SRAM area, and an n-well region 12d on the semiconductor substrate 10 in the PMIS region in the SRAM area.

Next, as illustrated in FIGS. 3A-3F, the surface of the semiconductor substrate 10 is cleaned with diluted hydrogen fluoride, and then a gate insulating film 13 of a silicon dioxide film with a thickness of, for example, about 2 nm is formed by in-situ steam generation (ISSG) oxidation on the active regions 10a, 10b, 10c, and 10d. Thereafter, the semiconductor substrate 10 is subjected to, for example, a nitrogen plasma process, thereby nitriding the surface of the gate insulating film 13 to form a nitrided layer (not shown). Then, annealing is performed, thereby removing nitrogen atoms with weak bonds from the nitrided layer. Subsequently, a silicon film 14 of, for example, polysilicon with a thickness of about 100 nm is deposited by, for example, chemical vapor deposition (CVD) over the gate insulating film 13.

Then, as illustrated in FIGS. 3A-3F, with a mask pattern 51A covering the entire NMIS region in the logic area and the entire SRAM area (i.e., the entire NMIS region and the entire PMIS region in the SRAM area) and exposing the entire PMIS region in the logic area, ions of a p-type impurity such as boron (B) are implanted into the silicon film 14 at a dose of $4 \times 10^{15}$ cm$^{-2}$, thereby forming a p-type silicon film 14P. Thereafter, with a mask pattern 52A covering the entire PMIS region in the logic area and exposing the entire NMIS region in the logic area and the entire SRAM area (i.e., the entire NMIS region and the entire PMIS region in the SRAM area), ions of an n-type impurity such as phosphorus (P) are implanted into the silicon film 14 at a dose of $3 \times 10^{15}$ cm$^{-2}$, thereby forming an n-type silicon film 14N. That is, as a feature of this embodiment, ions of the n-type impurity are implanted in the gate injection for the PMIS region in the SRAM area.

Formation of the p-type silicon film 14P and formation of the n-type silicon film 14N may be performed in any order. In FIGS. 3A-3F, not resist patterns formed on the semiconductor substrate 10 by photolithography but mask patterns on photomasks for forming these resist patterns are schematically shown as the mask patterns 51A and 52A for simplicity. The mask patterns 51A and 52A are designed such that the PN boundary 41L between the p-type silicon film 14P and the n-type silicon film 14N is located on a portion of the isolation region 11 between the active region 10a and the active region 10b.

After formation of the p-type silicon film 14P and the n-type silicon film 14N, the semiconductor substrate 10 is subjected to heat treatment at 850° C. for 30 seconds, for example, thereby uniformizing a profile (specifically a profile vertical to the principal surface of the substrate, hereinafter referred to as a vertical profile) of an impurity implanted in the form of ions into each of the p-type silicon film 14P and the n-type silicon film 14N.

Thereafter, a resist pattern (not shown) having a gate shape is formed by photolithography on the silicon film 14, and then using the resist pattern as a mask, the silicon film 14 is patterned by dry etching. In this manner, as illustrated in FIGS. 4A-4F, a gate electrode 30a including an n-type silicon film 14a is formed on the active region 10a with a gate insulating film 13a interposed therebetween, a gate electrode 30b including a p-type silicon film 14b is formed on the active region 10b with a gate insulating film 13b interposed therebetween, a gate electrode 30c including an n-type silicon film 14c is formed on the active region 10c with a gate insulating film 13c interposed therebetween, and a gate electrode 30d including an n-type silicon film 14d is formed on the active region 10d with a gate insulating film 13d interposed therebetween. The gate electrode 30a and the gate electrode 30b are connected to each other at the PN boundary 41L between the active region 10a and the active region 10b on the isolation region 11, thereby forming a dual-gate electrode 31L. The gate electrode 30c and the gate electrode 30d are connected to each other on a portion of the isolation region 11 between the active region 10c and the active region 10d, thereby forming a dual-gate electrode 31S. At the end of the process step shown in FIGS. 4A-4F, no PN boundary is formed in the dual-gate electrode 31S.

Subsequently, an insulating film for offset spacers of, for example, a silicon dioxide film with a thickness of 8 nm is deposited by, for example, CVD over the entire surface of the semiconductor substrate 10, and then the insulating film for offset spacers is subjected to anisotropic etching. In this manner, as illustrated in FIGS. 5A-5F, offset spacers 15a are formed on side surfaces of the gate insulating film 13a and the gate electrode 30a, offset spacers 15b are formed on side surfaces of the gate insulating film 13b and the gate electrode 30b, offset spacers 15c are formed on side surfaces of the gate insulating film 13c and the gate electrode 30c, and offset spacers 15d are formed on side surfaces of the gate insulating film 13d and the gate electrode 30d.

Then, a resist pattern (not shown) exposing each NMIS region and covering each PMIS region is formed on the semiconductor substrate 10, and then, using the resist pattern and the gate electrodes 30a and 30c as masks, ions of an n-type impurity such as arsenic (As) are implanted. With this process, as illustrated in FIGS. 5A-5D, n-type source/drain regions (e.g., lightly doped drain (LDD) regions or extension regions) 16a and 16c having relatively shallow junction depths are defined in a self-aligned manner in portions of the active region 10a below the sides of the gate electrode 30a and in portions of the active region 10c below the sides of the gate electrode 30c. Subsequently, a resist pattern (not shown) covering each NMIS region and exposing each PMIS region is formed on the semiconductor substrate 10, and using the resist pattern and the gate electrodes 30b and 30d as masks, ions of a p-type impurity such as $BF_2$ are implanted. With this process, as illustrated in FIGS. 5A-5D, p-type source/drain regions (e.g., LDD regions or extension regions) 16b and 16d having relatively shallow junction depths are defined in a self-aligned manner in portions of the active region 10b below the sides of the gate electrode 30b and portions of the active region 10d below the sides of the gate electrode 30d.

Formation of the n-type source/drain regions 16a and 16c and formation of the p-type source/drain regions 16b and 16d may be performed in any order.

Then, a first insulating film of, for example, a silicon dioxide film with a thickness of about 10 nm and a second insulating film of, for example, a silicon nitride film with a thickness of about 30 nm are deposited in this order by, for example, CVD over the entire surface of the semiconductor substrate 10, and then the first insulating film and the second insulating film are subjected to anisotropic etching. In this manner, as illustrated in FIGS. 6A-6F, sidewall spacers 19a are formed on side surfaces of the gate electrode 30a with the offset spacers 15a interposed therebetween, sidewall spacers 19b are formed on side surfaces of the gate electrode 30b with the offset spacers 15b interposed therebetween, sidewall spacers 19c are formed on side surfaces of the gate electrode 30c with the offset spacers 15c interposed therebetween, and sidewall spacers 19d are formed on side surfaces of the gate electrode 30d with the offset spacers 15d interposed therebetween. Each of the sidewall spacers 19a includes an inner sidewall 17a having an L shape in cross section and made of the first insulating film and an outer sidewall 18a located on the inner sidewall 17a and made of the second insulating film. Each of the sidewall spacers 19b includes an inner sidewall 17b having an L shape in cross section and made of the first insulating film and an outer sidewall 18b located on the inner sidewall 17b and made of the second insulating film. Each of the sidewall spacers 19c includes an inner sidewall 17c having an L shape in cross section and made of the first insulating film and an outer sidewall 18c located on the inner sidewall 17c and made of the second insulating film. Each of the sidewall spacers 19d includes an inner sidewall 17d having an L shape in cross section and made of the first insulating film and an outer sidewall 18d located on the inner sidewall 17d and made of the second insulating film.

Subsequently, as illustrated in FIGS. 6A-6F, using a mask pattern 53 covering the entire NMIS region in the logic area and the entire NMIS region in the SRAM area, the gate electrode 30b, the offset spacers 15b, and the sidewall spacers 19b in the active region 10b, and the gate electrode 30d, the offset spacers 15d, and the sidewall spacers 19d in the active region 10d as mask, ions of a p-type impurity such as boron (B) are implanted into the active region 10b and the active region 10d at a dose of $5 \times 10^{15}$ cm$^{-2}$. In this manner, p-type source/drain regions 20b having a junction depth deeper than that of the shallow p-type source/drain regions 16b and connected to the p-type source/drain regions 16b are defined in a self-aligned manner below the outer sides of the sidewall spacers 19b in the active region 10b, and p-type source/drain regions 20d having a junction depth deeper than that of the shallow p-type source/drain regions 16d and connected to the p-type source/drain regions 16d are defined in a self-aligned manner below the outer sides of the sidewall spacers 19d in the active region 10d. In this process step, the p-type impurity is also implanted into the p-type silicon film 14b forming the gate electrode 30b and the n-type silicon film 14d' forming the gate electrode 30d, thereby increasing the p-type impurity concentration of the p-type silicon film 14b and changing the n-type silicon film 14d' into the p-type silicon film 14d. In this manner, a PN boundary 41S between the n-type silicon film 14c (the gate electrode 30c) and the p-type silicon film n 14d (the gate electrode 30d) is formed in the dual-gate electrode 31S. At this time, the p-type impurity concentration of the p-type silicon film 14b is higher than that of the p-type silicon film 14d.

Thereafter, as illustrated in FIGS. 6A-6F, using a mask pattern 54 covering the entire PMIS region in the logic area and the entire PMIS region in the SRAM area, the gate electrode 30a, the offset spacers 15a, and the sidewall spacers 19a in the active region 10a, and the gate electrode 30c, the offset spacers 15c, and the sidewall spacers 19c in the active region 10c as masks, ions of an n-type impurity such as arsenic (As) are implanted into the active region 10a and the active region 10c at a dose of $4 \times 10^{15}$ to $5 \times 10^{15}$ cm$^{-2}$. In this manner, n-type source/drain regions 20a having a junction depth deeper than that of the shallow n-type source/drain regions 16a and connected to the n-type source/drain regions 16a are defined in a self-aligned manner below the outer sides of the sidewall spacers 19a in the active region 10a, and n-type source/drain regions 20c having a junction depth deeper than that of the shallow n-type source/drain regions 16c and connected to the n-type source/drain regions 16c are defined in a self-aligned manner below the outer sides of the sidewall spacers 19c in the active region 10c.

Formation of the p-type source/drain regions 20b and 20d and formation of the n-type source/drain regions 20a and 20c may be performed in any order. In FIGS. 6A-6F, not resist patterns formed by photolithography on the semiconductor substrate 10 but mask patterns on photomasks for forming the resist patterns are schematically shown as the mask patterns 53 and 54 for simplicity. The mask patterns 53 and 54 are designed such that the location (i.e., on a portion of the isolation region 11 between the active region 10a and the active region 10b) of the PN boundary 41L between the p-type silicon film 14a (the gate electrode 30a) and the n-type silicon film 14b (the gate electrode 30b) is not changed and that the PN boundary 41S between the p-type silicon film 14c (the gate electrode 30c) and the n-type silicon film 14d (the gate electrode 30d) is located on a portion of the isolation region 11 between the active region 10c and the active region 10d.

After formation of the n-type source/drain regions 20a and 20c and the p-type source/drain regions 20b and 20d, the semiconductor substrate 10 is subjected to heat treatment, thereby activating the impurities implanted into the n-type source/drain regions 20a and 20c and the p-type source/drain regions 20b and 20d.

Then, natural oxide films (not shown) on the surfaces of the deep n-type source/drain regions 20a and 20c and the deep p-type source/drain regions 20b and 20d are removed, and then a metal film (not shown) of, for example, nickel with a thickness of about 10 nm is deposited by, for example, sputtering over the entire surface of the semiconductor substrate 10. Thereafter, first rapid thermal annealing (RTA) is performed on the semiconductor substrate 10 at, for example, 320° C. in, for example, a nitrogen atmosphere, thereby causing silicon (Si) in surface portions of the deep n-type source/drain regions 20a and 20c and the deep p-type source/drain regions 20b and 20d and nickel (Ni) in the metal film to react with each other. In this manner, as illustrated in FIGS. 7A-7F, metal silicide layers 21a-21d of nickel silicide are formed on the deep n-type source/drain regions 20a and 20c and the deep p-type source/drain regions 20b and 20d. In this process step, Si in surface portions of the n-type silicon films 14a and 14c constituting the gate electrode 30a and 30c and the p-type silicon films 14b and 14d constituting the gate electrodes 30b and 30d also reacts with Ni in the metal film, thereby forming metal silicide layers 22a-22d of nickel silicide on the gate electrodes 30a-30d. Subsequently, the semiconductor substrate 10 is immersed in an etchant of a mixed solution of, for example, sulfuric acid and a hydrogen peroxide solution, thereby removing unreacted portions of the metal film remaining on, for example, the isolation region 11, the offset spacers 15a-15d, and the sidewall spacers 19a-19d. Then, second RTA is performed at a temperature (e.g., 550° C.) higher than that in the first RTA, thereby stabilizing the silicide content in each of the metal silicide layers 21a-21d and the metal silicide layers 22a-22d.

Thereafter, as illustrated in FIGS. 8A-8F, an insulating film 23 of, for example, a silicon nitride film a thickness of about 20 nm is deposited by, for example, plasma CVD over the entire surface of the semiconductor substrate 10. Then, an interlayer insulating film 24 of, for example, a silicon dioxide film is deposited by, for example, CVD over the insulating film 23. Subsequently, the surface of the interlayer insulating film 24 is planarized by, for example, chemical mechanical polishing (CMP). Then, as in a method for fabricating a semiconductor device with a general MIS transistor, a resist film (not shown) having a contact hole pattern is formed on the interlayer insulating film 24, and using the resist film as a mask, contact holes 25a-25d are formed by dry etching in the insulating film 23 and the interlayer insulating film 24 such that the contact holes 25a-25d reach the upper surfaces of the metal silicide layers 21a-21d, respectively. In this process step, a two-step etching process in which etching is temporarily stopped when the insulating film 23 is exposed is employed, thereby reducing the amount of overetching of the metal silicide layers 21a-21d. Thereafter, a barrier metal film (not shown) as a stack of, for example, a titanium film and a titanium nitride film is formed by, for example, sputtering or CVD on each of the bottoms and side surfaces of the contact holes 25a-25d. Subsequently, a tungsten film, for example, is deposited by CVD over the interlayer insulating film 24 to fill the contact holes 25a-25d, and then portions of the tungsten film located outside the contact holes 25a-25d are removed by, for example, CMP. In this manner, contacts 26a-26d in each of which the tungsten film is buried with the barrier metal film interposed between the contact hole and the tungsten film are formed in the contact holes 25a-25d. Thereafter, metal interconnects (not shown) electrically connected to the contacts 26a-26d are formed on the interlayer insulating film 24.

In the foregoing manner, the semiconductor device of this embodiment, i.e., the semiconductor device including: an NMISFET located in the logic area and including the gate electrode 30a having the n-type silicon film 14a; a PMISFET located in the logic area and including the gate electrode 30b having the p-type silicon film 14b; an NMISFET located in the SRAM area and including the gate electrode 30c having the n-type silicon film 14c; and a PMISFET located in the SRAM area and including the gate electrode 30d having the p-type silicon film 14d, can be fabricated.

In this embodiment, in forming the gate electrodes 30a-30d by dry-etching the silicon film 14, substantially only the n-type impurity is present in portions of the silicon film 14 constituting the gate electrodes 30c and 30d in the SRAM area susceptible to the influence of mutual diffusion of the impurities because of a small width of the isolation region 11 (specifically a portion of the isolation region 11 between the active region 10c and the active region 10d). Accordingly, it is possible to avoid occurrence of difference in the etching speed of the silicon film 14 caused by difference between ion species of the implanted impurities. Thus, no difference occurs in gate dimensions between the gate electrode 30c of the NMISFET and the gate electrode 30d of the PMISFET, thereby reducing variations in transistor characteristics due to variations in gate length. In addition, in dry-etching the silicon film 14, it is necessary to uniformize the vertical profile of an impurity implanted into the silicon film 14 beforehand by annealing. However, in this embodiment, since substantially only an n-type impurity is present in a portion of the silicon film 14 located in the SRAM area at the time when the silicon film 14 is etched, the influence of mutual diffusion (specifically diffusion in the direction parallel to the principal surface of the substrate) of the impurities due to the annealing is substantially negligible. As a result, variations in transistor characteristics can be further reduced.

In this embodiment, in an a portion of the silicon film 14 constituting the gate electrode 30d of the PMIS region in the SRAM area, the n-type impurity is implanted in the gate injection, whereas the p-type impurity is implanted in source/drain implantation. Accordingly, to form the PMISFET in the SRAM area as a surface channel type, the n-type impurity concentration in the gate injection is preferably lower than the p-type impurity concentration in the source/drain implantation. In this case, as a feature of this embodiment, the p-type impurity concentration of the p-type silicon film 14b constituting the gate electrode 30b in the PMIS region in the logic area is higher than that of the p-type silicon film 14d in constituting the gate electrode 30d in the PMIS region in the SRAM area.

In this embodiment, gate injection of the n-type impurity is performed on the NMIS region and the PMIS region in the SRAM area, and then source/drain implantation of the p-type impurity is performed, thereby reversing the conductivity type of a portion of the silicon film 14 constituting the gate electrode 30d in the PMIS region in the SRAM area to the p-type. Alternatively, the conductivity type of a portion of the silicon film 14 constituting the gate electrode 30c in the NMIS region in the SRAM area may be reversed to the n-type by performing gate injection of the p-type impurity on the NMIS region and the PMIS region in the SRAM area and then performing source/drain implantation of the n-type impurity.

Second Embodiment

A semiconductor device according to a second embodiment of the present disclosure will be described hereinafter with reference to the drawings.

FIG. 9A is a plan view illustrating a logic area of the semiconductor device of the second embodiment. FIG. 9B is a cross-sectional view taken along the line I-I (along the gate width) in FIG. 9A. FIG. 9C is a plan view illustrating an SRAM area of the semiconductor device of the second embodiment. FIG. 9D is a cross-sectional view taken along the line II-II (along the gate width) in FIG. 9C. In FIGS. 9A-9D, sidewall spacers, a silicide layer, and an interlayer film, for example, are not shown for simplicity, and contacts are not shown in FIGS. 9B and 9D. In FIGS. 9A-9D, components already shown in FIGS. 1A-1D for the first embodiment are denoted by the same reference characters, and descriptions thereof will not be repeated and only different characteristics will be described hereinafter.

The second embodiment is different from the first embodiment in the following aspects. As illustrated in FIGS. 9A and 9B, a dual-gate electrode 31L in a logic area includes: a gate electrode 30a located in an NMIS region and including an n-type silicon film 14a1 provided on an active region 10a and a portion of an isolation region 11 near the active region 10a and an n-type silicon film 14a2 provided on portions of the isolation region 11 at both ends of the n-type silicon film 14a1; and a gate electrode 30b located on a PMIS region and including a p-type silicon film 14b1 provided on an active region 10b and a portion of the isolation region 11 near the active region 10b and a p-type silicon film 14b2 provided on portions of the isolation region 11 at both ends of the p-type silicon film 14b1.

The configuration of the SRAM area illustrated in FIGS. 9C and 9D including the structure of a dual-gate electrode 31S is the same as that in the SRAM area of the first embodiment illustrated in FIGS. 1C and 1D. Specifically, in the same manner as in the first embodiment, the dual-gate electrode 31S includes a gate electrode 30c located on an NMIS region and including an n-type silicon film 14c and a gate electrode 30d located on a PMIS region and including a p-type silicon film 14d.

A feature of this embodiment is that the p-type silicon film 14b1 has a p-type impurity concentration lower than that of the p-type silicon film 14b2. In addition, each of the p-type silicon film 14b1 and the p-type silicon film 14b2 has a p-type impurity concentration higher than that of the p-type silicon film 14d. The n-type silicon film 14a1 has an n-type impurity concentration lower than that of each of the n-type silicon film 14a2 and the n-type silicon film 14c. The n-type silicon film 14a2 has an n-type impurity concentration substantially equal to that of the n-type silicon film 14c.

A method for fabricating a semiconductor device according to the second embodiment will be described hereinafter with reference to the drawings. The method for fabricating a semiconductor device of this embodiment is different from that of the first embodiment only in the location of gate injection in the logic area (see FIGS. 10A-10F).

FIGS. 10A-10F are cross-sectional views illustrating a process step of the method for fabricating a semiconductor device of the second embodiment. FIG. 10A illustrates a cross-sectional structure in the process step taken along the line III-III (along the gate length) in FIG. 9A. FIG. 10B illustrates a cross-sectional structure in the process step taken along the line IV-IV (along the gate length) in FIG. 9A. FIG. 10C illustrates a cross-sectional structure in the process step taken along the line V-V (along the gate length) in FIG. 9C. FIG. 10D illustrates a cross-sectional structure in the process step taken along the line VI-VI (along the gate length) in FIG. 9C. FIG. 10E illustrates a cross-sectional structure in the process step taken along the line I-I (along the gate width) in FIG. 9A. FIG. 10F illustrates a cross-sectional structure in the process step taken along the line II-II (along the gate width) in FIG. 9C.

In this embodiment, first, the same process step as that of the first embodiment illustrated in FIGS. 2A-2F is performed. Thereafter, as illustrated in FIGS. 10A-10F, the surface of a semiconductor substrate 10 is cleaned with, for example, diluted hydrogen fluoride, and then a gate insulating film 13 of, for example, a silicon dioxide film with a thickness of about 2 nm is deposited by, for example, ISSG oxidation on the active regions 10a, 10b, 10c, and 10d. Subsequently, the semiconductor substrate 10 is subjected to, for example, a nitrogen plasma process, thereby nitriding the surface of the gate insulating film 13 to form a nitrided layer (not shown). Then, annealing is performed, thereby removing nitrogen atoms with weak bonds from the nitrided layer. Subsequently, a silicon film 14 of, for example, polysilicon with a thickness of about 100 nm is deposited by, for example, CVD over the gate insulating film 13.

Then, as illustrated in FIGS. 10A-10F, with a mask pattern 51B covering the entire NMIS region and the active region 10b in the PMIS region in the logic area and the entire SRAM area (i.e., the entire NMIS region and the entire PMIS region in the SRAM area) and exposing the isolation region 11 in the PMIS region in the logic area, ions of a p-type impurity such as boron (B) are implanted into the silicon film 14 at a dose of $4 \times 10^{15}$ cm$^{-2}$, thereby forming a p-type silicon film 14P on a portion of the isolation region 11 in the PMIS region in the logic area. In this process step, the length (e.g., about 50 nm) of a portion of the isolation region 11 covered with the mask pattern 51B near the active region 10b in the PMIS region in the logic area is determined in consideration of the influence of mutual diffusion of the impurities. Thereafter, with a mask pattern 52B covering the entire PMIS region and the active region 10a in the NMIS region in the logic area and exposing the isolation region 11 in the NMIS region in the logic area and the entire SRAM area (i.e., the entire NMIS region and the entire PMIS region in the SRAM area), ions of an n-type impurity such as phosphorus (P) are implanted into the silicon film 14 at a dose of $3 \times 10^{15}$ cm$^{-2}$, thereby forming an n-type silicon film 14N on a portion of the isolation region 11 located in the NMIS region in the logic area and the entire SRAM area. In this process step, the length (e.g., about 50 nm) of a portion of the isolation region 11 covered with the mask pattern 51B near the active region 10a in the NMIS region in the logic area is determined in consideration of the influence of mutual diffusion of the impurities. That is, in this embodiment, ions of the n-type impurity are implanted in gate injection for the PMIS region in the SRAM area in the same manner as in the first embodiment.

Formation of the p-type silicon film 14P and formation of the n-type silicon film 14N may be performed in any order. In FIGS. 10A-10F, not resist patterns formed on the semiconductor substrate 10 by photolithography but mask patterns on photomasks for forming these resist patterns are schematically shown as the mask patterns 51B and 52B for simplicity. The mask patterns 51B and 52B are designed such that a PN boundary 41L between the p-type silicon film 14P and the n-type silicon film 14N is located on a portion of the isolation region 11 between the active region 10a and the active region 10b.

After formation of the p-type silicon film 14P and the n-type silicon film 14N, the semiconductor substrate 10 is subjected to heat treatment at 850° C. for 30 seconds, for example, thereby uniformizing a vertical profile of an impurity implanted as ions into each of the p-type silicon film 14P and the n-type silicon film 14N.

Thereafter, process steps similar to the process step (gate patterning) illustrated in FIGS. 4A-4F, the process step (formation of offset spacers and shallow source/drain regions) illustrated in FIGS. 5A-5F, the process step (formation of sidewall spacers and deep source/drain regions) illustrated in FIGS. 6A-6F, the process step (formation of a silicide layer) illustrated in FIGS. 7A-7F, and the process step (formation of an interlayer insulating film and a contact silicide layer) illustrated in FIGS. 8A-8F of the first embodiment are performed in order.

In the foregoing manner, the semiconductor device of this embodiment, i.e., the semiconductor device including: an NMISFET located in the logic area and including the gate electrode 30a having the n-type silicon films 14a1 and 14a2; a PMISFET located in the logic area and including the gate electrode 30b having the p-type silicon films 14b1 and 14b2; an NMISFET located in the SRAM area and including the gate electrode 30c having the n-type silicon film 14c; and a PMISFET located in the SRAM area and including the gate electrode 30d having the p-type silicon film 14d, can be fabricated.

In this embodiment, in forming the gate electrodes 30a-30d by dry-etching the silicon film 14, substantially only the n-type impurity is present in portions of the silicon film 14 constituting the gate electrodes 30c and 30d in the SRAM area susceptible to the influence of mutual diffusion of the impurities because of a small width of the isolation region 11 (specifically a portion of the isolation region 11 between the active region 10c and the active region 10d). Accordingly, it is possible to avoid occurrence of difference in the etching speed of the silicon film 14 caused by difference between ion species of the implanted impurities. Thus, no difference occurs in gate dimensions between the gate electrode 30c of the NMISFET and the gate electrode 30d of the PMISFET, thereby reducing variations in transistor characteristics due to variations in gate length. In addition, in dry-etching the silicon film 14, it is necessary to uniformize the vertical profile of an impurity implanted into the silicon film 14. However, in this embodiment, since substantially only the n-type impurity is present in a portion of the silicon film 14 located in the SRAM area at the time when the silicon film 14 is etched in the same manner as in the first embodiment, the influence of mutual diffusion (specifically diffusion in the direction parallel to the principal surface of the substrate) of the impurities due to the annealing is substantially negligible. As a result, variations in transistor characteristics can be further reduced.

In this embodiment, in forming the gate electrodes 30a-30d by dry-etching the silicon film 14, substantially no impurities are implanted into portions of the silicon film 14 at least on the active regions 10a and 10b in the logic area. Accordingly, it is possible to avoid occurrence of difference in the etching speed of the silicon film 14 caused by difference between ion species of the implanted impurities. Thus, no difference occurs in gate dimensions between the gate electrode 30a of the NMISFET and the gate electrode 30b of the PMISFET, thereby reducing variations in transistor characteristics due to variations in gate length.

In addition, in this embodiment, in a portion of the silicon film 14 constituting the gate electrode 30d in the PMIS region in the SRAM area, the n-type impurity is implanted in the gate injection, whereas the p-type impurity is implanted in source/drain implantation. Accordingly, to form the PMISFET in the SRAM area as a surface channel type, the n-type impurity concentration in the gate injection is preferably lower than the p-type impurity concentration in the source/drain implantation, as in the first embodiment. In this case, as a feature of this embodiment, the p-type impurity concentration of each of the p-type silicon films 14b1 and 14b2 constituting the gate electrode 30b in the PMIS region in the logic area is higher than that of the p-type silicon film 14d in constituting the gate electrode 30d in the PMIS region in the SRAM area.

Further, in this embodiment, the n-type silicon film 14a1 on the active region 10a formed in the logic area has an n-type impurity concentration lower than that of the n-type silicon film 14a2 on a portion of the isolation region 11 formed in the logic area, and the p-type silicon film 14b1 on the active region 10b formed in the logic area has a p-type impurity concentration lower than that of the p-type silicon film 14b2 on a portion of the isolation region 11 formed in the logic area. Accordingly, although the gate electrodes 30a and 30b on the active regions 10a and 10b formed in the logic area have high resistances, metal silicide layers 22a and 22b are formed on the gate electrodes 30a and 30b, and the gate electrodes 30a and 30b (i.e., gate lines) on portions of the isolation region 11 formed in the logic area have high impurity concentrations similar to those in the first embodiment. In this manner, a delay of the circuit speed due to increase in resistance of the gate electrodes 30a and 30b on the active regions 10a and 10b can be reduced. Since no impurities are implanted into portions of the silicon film 14 constituting the gate electrodes 30a and 30b on the active regions 10a and 10b in gate injection in this embodiment, an impurity in an amount necessary for preventing formation of depletion in the final structure needs to be implanted in source/drain implantation. In a case where a delay of the circuit speed due to an increase in resistance of the gate electrodes 30a and 30b on the active regions 10a and 10b has a small influence, an impurity does not need to be implanted into portions the silicon film 14 constituting the gate electrodes 30a and 30b on portions of the isolation region 11 formed in the logic area in gate injection.

In this embodiment, gate injection of the n-type impurity is performed on the NMIS region and the PMIS region in the SRAM area, and then source/drain implantation of the p-type impurity is performed, thereby reversing the conductivity type of a portion of the silicon film 14 constituting the gate electrode 30d in the PMIS region in the SRAM area to the p-type. Alternatively, the conductivity type of a portion of the silicon film 14 constituting the gate electrode 30c in the NMIS region in the SRAM area may be reversed to the n-type by performing gate injection of an p-type impurity on the NMIS region and the PMIS region in the SRAM area and then performing source/drain implantation of an n-type impurity.

Third Embodiment

A semiconductor device according to a third embodiment of the present disclosure will be described hereinafter with reference to the drawings.

FIG. 11A is a plan view illustrating a logic area of the semiconductor device of the third embodiment. FIG. 11B is a cross-sectional view taken along the line I-I (along the gate width) in FIG. 11A. FIG. 11C is a plan view illustrating an SRAM area of the semiconductor device of the third embodiment. FIG. 11D is a cross-sectional view taken along the line II-II (along the gate width) in FIG. 11C. In FIGS. 11A-11D, sidewall spacers, a silicide layer, and an interlayer film, for example, are not shown for simplicity, and contacts are not shown in FIGS. 11B and 11D. In FIGS. 11A-11D, components already shown in FIGS. 1A-1D for the first embodiment are denoted by the same reference characters, and descriptions thereof will not be repeated and only different characteristics will be described hereinafter.

The third embodiment is different from the first embodiment in the following aspects. As illustrated in FIGS. 11A and 11B, in the same manner as in the second embodiment illustrated in FIGS. 9A and 9B, a dual-gate electrode 31L includes: a gate electrode 30a located in an NMIS region and including an n-type silicon film 14a1 provided on an active region 10a and a portion of the isolation region 11 near the active region 10a and an n-type silicon film 14a2 provided on portions of the isolation region 11 at both ends of the n-type silicon film 14a1; and a gate electrode 30b located on a PMIS region and including a p-type silicon film 14b1 provided on an active region 10b and a portion of the isolation region 11 near the active region 10b and a p-type silicon film 14b2 provided on portions of the isolation region 11 at both ends of the p-type silicon film 14b1.

The configuration of an SRAM area illustrated in FIGS. 11C and 11D including the structure of a dual-gate electrode 31S is basically the same as that in the SRAM area of the first embodiment illustrated in FIGS. 1C and 1D. Specifically, in the same manner as in the first embodiment, the dual-gate electrode 31S includes a gate electrode 30c located in an NMIS region and including an n-type silicon film 14c and a gate electrode 30d located in a PMIS region and including a p-type silicon film 14d. However, in this embodiment, the n-type impurity concentration of the n-type silicon film 14c and the p-type impurity concentration of the p-type silicon film 14d are lower than those in the first embodiment.

A feature of this embodiment is that the p-type silicon film 14b2 has a p-type impurity concentration higher than that of the p-type silicon film 14d and that the p-type silicon film 14b1 has a p-type impurity concentration substantially equal to that of the p-type silicon film 14d. Specifically, the p-type silicon film 14b1 has a p-type impurity concentration lower than that of the p-type silicon film 14b2. The n-type silicon film 14a1 has an n-type impurity concentration substantially equal to that of the n-type silicon film 14c. The n-type silicon film 14a1 has an n-type impurity concentration lower than that of the n-type silicon film 14a2. Specifically, the n-type silicon film 14a2 has an n-type impurity concentration lower than that of the n-type silicon film 14c.

A method for fabricating a semiconductor device according to the third embodiment will be described hereinafter with reference to the drawings. The method for fabricating a semiconductor device of this embodiment is different from that of the first embodiment only in the location of gate injection in each of the logic area and the SRAM area (see FIGS. 12A-12F).

FIGS. 12A-12F are cross-sectional views illustrating a process step of the method for fabricating a semiconductor device of the third embodiment. FIG. 12A illustrates a cross-sectional structure in the process step taken along the line III-III (along the gate length) in FIG. 11A. FIG. 12B illustrates a cross-sectional structure in the process step taken along the line IV-IV (along the gate length) in FIG. 11A. FIG. 12C illustrates a cross-sectional structure in the process step taken along the line V-V (along the gate length) in FIG. 11C. FIG. 12D illustrates a cross-sectional structure in the process step taken along the line VI-VI (along the gate length) in FIG. 11C. FIG. 12E illustrates a cross-sectional structure in the process step taken along the line I-I (along the gate width) in FIG. 11A. FIG. 12F illustrates a cross-sectional structure in the process step taken along the line (along the gate width) in FIG. 11C.

In this embodiment, first, the same process step as that of the first embodiment illustrated in FIGS. 2A-2F is performed. Thereafter, as illustrated in FIGS. 12A-12F, the surface of a semiconductor substrate 10 is cleaned with, for example, diluted hydrogen fluoride, and then a gate insulating film 13 of, for example, a silicon dioxide film with a thickness of about 2 nm is deposited by, for example, ISSG oxidation on the active regions 10a, 10b, 10c, and 10d. Subsequently, the semiconductor substrate 10 is subjected to, for example, a nitrogen plasma process, thereby nitriding the surface of the gate insulating film 13 to form a nitrided layer (not shown). Then, annealing is performed, thereby removing nitrogen atoms with weak bonds from the nitrided layer. Subsequently, a silicon film 14 of, for example, polysilicon with a thickness of about 100 nm is deposited by, for example, CVD over the gate insulating film 13.

Then, as illustrated in FIGS. 12A-12F, with a mask pattern 51C covering the entire NMIS region and the active region 10b in the PMIS region in the logic area and the entire SRAM area (i.e., the entire NMIS region and the entire PMIS region in the SRAM area) and exposing the isolation region 11 in the PMIS region in the logic area, ions of a p-type impurity such as boron (B) are implanted into the silicon film 14 at a dose of $4 \times 10^{15}$ cm$^{-2}$, thereby forming a p-type silicon film 14P on a portion of the isolation region 11 in the PMIS region in the logic area. In this process step, the length (e.g., about 50 nm) of a portion of the isolation region 11 covered with the mask pattern 51C near the active region 10b in the PMIS region in the logic area is determined in consideration of the influence of mutual diffusion of the impurities. Thereafter, with a mask pattern 52C covering the entire PMIS region and the active region 10a in the NMIS region in the logic area and the entire SRAM area (i.e., the entire NMIS region and the entire PMIS region in the SRAM area) and exposing the isolation region 11 in the NMIS region in the logic area, ions of an n-type impurity such as phosphorus (P) are implanted into the silicon film 14 at a dose of $3 \times 10^{15}$ cm$^{-2}$, thereby forming an n-type silicon film 14N on a portion of the isolation region 11 located in the NMIS region in the logic area. In this process step, the length (e.g., about 50 nm) of a portion of the isolation region 11 covered with the mask pattern 52C near the active region 10a in the NMIS region in the logic area is determined in consideration of the influence of mutual diffusion of the impurities. That is, in this embodiment, no gate injection is performed on any of the NMIS region and PMIS region in the SRAM area, unlike the first and second embodiments.

Formation of the p-type silicon film 14P and formation of the n-type silicon film 14N may be performed in any order. In FIGS. 12A-12F, not resist patterns formed on the semiconductor substrate 10 by photolithography but mask patterns on photomasks for forming these resist patterns are schematically shown as the mask patterns 51C and 52C for simplicity. The mask patterns 51C and 52C are designed such that a PN boundary 41L between the p-type silicon film 14P and the n-type silicon film 14N is located on a portion of the isolation region 11 between the active region 10a and the active region 10b.

After formation of the p-type silicon film 14P and the n-type silicon film 14N, the semiconductor substrate 10 is subjected to heat treatment at, for example, 850° C. for 30 seconds, thereby uniformizing a vertical profile of an impurity implanted as ions into each of the p-type silicon film 14P and the n-type silicon film 14N.

Thereafter, process steps similar to the process step (gate patterning) illustrated in FIGS. 4A-4F and the process step (formation of offset spacers and shallow source/drain regions) illustrated in FIGS. 5A-5F, the process step (formation of sidewall spacers and deep source/drain regions) illustrated in FIGS. 6A-6F, the process step (formation of a silicide layer) illustrated in FIGS. 7A-7F, and the process step (formation of an interlayer insulating film and a contact silicide layer) illustrated in FIGS. 8A-8F of the first embodiment are performed in order.

In the foregoing manner, the semiconductor device of this embodiment, i.e., the semiconductor device including: an NMISFET located in the logic area and including the gate electrode 30a having the n-type silicon films 14a1 and 14a2; a PMISFET located in the logic area and including the gate electrode 30b having the p-type silicon films 14b1 and 14b2; an NMISFET located in the SRAM area and including the gate electrode 30c having the n-type silicon film 14c; and a PMISFET located in the SRAM area and including the gate electrode 30d having the p-type silicon film 14d, can be fabricated.

In this embodiment, in forming the gate electrodes 30a-30d by dry-etching the silicon film 14, no impurities are implanted into portions of the silicon film 14 constituting the gate electrodes 30c and 30d in the SRAM area susceptible to the influence of mutual diffusion of the impurities because of a small width of the isolation region 11 (specifically a portion of the isolation region 11 between the active region 10c and the active region 10d). Accordingly, it is possible to avoid occurrence of difference in the etching speed of the silicon film 14 caused by difference between ion species of the implanted impurities. Thus, no difference occurs in gate dimensions between the gate electrode 30c of the NMISFET and the gate electrode 30d of the PMISFET, thereby reducing variations in transistor characteristics due to variations in gate length. In addition, in dry-etching the silicon film 14, it is necessary to uniformize the vertical profile of an impurity implanted into the silicon film 14 beforehand by annealing. However, in this embodiment, since substantially no impurities are implanted into a portion of the silicon film 14 located in the SRAM area at the time when the silicon film 14 is etched, the influence of mutual diffusion (specifically diffusion in the direction parallel to the principal surface of the substrate) of the impurities due to the annealing is substantially negligible. As a result, variations in transistor characteristics can be further reduced.

In this embodiment, in forming the gate electrodes 30a-30d by dry-etching the silicon film 14, substantially no impurities are implanted into portions of the silicon film 14 at least on the active regions 10a and 10b in the logic area. Accordingly, it is possible to avoid occurrence of difference in the etching speed of the silicon film 14 caused by difference between ion species of the implanted impurities. Thus, no difference occurs in gate dimensions between the gate electrode 30a of the NMISFET and the gate electrode 30b of the PMISFET, thereby reducing variations in transistor characteristics due to variations in gate length.

In addition, in this embodiment, the n-type silicon film 14a1 on the active region 10a formed in the logic area has an n-type impurity concentration lower than that of the n-type silicon film 14a2 on a portion of the isolation region 11 formed in the logic area, and the p-type silicon film 14b1 on the active region 10b formed in the logic area has a p-type impurity concentration lower than that of the p-type silicon film 14b2 on a portion of the isolation region 11 formed in the logic area. Accordingly, although the gate electrodes 30a and 30b on the active regions 10a and 10b formed in the logic area have high resistances, metal silicide layers 22a and 22b are formed on the gate electrodes 30a and 30b, and the gate electrodes 30a and 30b (i.e., gate lines) on portions of the isolation region 11 formed in the logic area have high impurity concentrations similar to those in the first embodiment. In this manner, a delay of the circuit speed due to increase in resistance of the gate electrodes 30a and 30b on the active regions 10a and 10b can be reduced. Since no impurities are implanted into the silicon film 14 constituting the gate electrodes 30a and 30b on the active regions 10a and 10b in gate injection in this embodiment, an impurity in an amount necessary for preventing formation of depletion in the final structure needs to be implanted in source/drain implantation. In a case where a delay of the circuit speed due to an increase in resistance of the gate electrodes 30a and 30b on the active regions 10a and 10b has a small influence, an impurity does not need to be implanted into portions of the silicon film 14 constituting the gate electrodes 30a and 30b on portions of the isolation region 11 formed in the logic area in gate injection.

Further, in this embodiment, no impurities are implanted into portions of the silicon film 14 constituting the gate electrodes 30c and 30d in the SRAM area in gate injection, i.e., impurities are implanted into portions of the silicon film 14 constituting the gate electrodes 30c and 30d only in source/drain implantation. Thus, the gate electrodes 30c and 30d have resistances higher than those of the gate electrodes 30a and 30b in the logic area. However, since transistors for SRAM circuits do not need to operate at high speed, unlike transistors for logic circuits, the influence of, for example, a delay of the circuit speed due to increase in resistance of the gate electrodes 30c and 30d is small.

Fourth Embodiment

A semiconductor device according to a fourth embodiment of the present disclosure will be described hereinafter with reference to the drawings.

FIG. 13A is a plan view illustrating a logic area of the semiconductor device of the fourth embodiment. FIG. 13B is a cross-sectional view taken along the line I-I (along the gate width) in FIG. 13A. FIG. 13C is a plan view illustrating an SRAM area of the semiconductor device of the fourth embodiment. FIG. 13D is a cross-sectional view taken along the line II-II (along the gate width) in FIG. 13C. In FIGS. 13A-13D, sidewall spacers, a silicide layer, and an interlayer film, for example, are not shown for simplicity, and contacts are not shown in FIGS. 13B and 13D. In FIGS. 13A-13D, components already shown in FIGS. 1A-1D for the first embodiment are denoted by the same reference characters, and descriptions thereof will not be repeated and only different characteristics will be described hereinafter.

The configuration of the logic area illustrated in FIGS. 13A and 13B including the structure of a dual-gate electrode 31L is the same as that of the logic area of the first embodiment illustrated in FIGS. 1A and 1B. Specifically, in the same manner as in the first embodiment, the dual-gate electrode 31L includes a gate electrode 30a located in an NMIS region and including an n-type silicon film 14a and a gate electrode 30b located in a PMIS region and including a p-type silicon film 14b.

On the other hand, the configuration of the SRAM area illustrated in FIGS. 13C and 13D including the structure of a dual-gate electrode 31S is basically the same as that in the SRAM area of the first embodiment illustrated in FIGS. 1C and 1D. Specifically, in the same manner as in the first embodiment, the dual-gate electrode 31S includes a gate electrode 30c located on an NMIS region and including an n-type silicon film 14c and a gate electrode 30d located on a PMIS region and including a p-type silicon film 14d. However, in this embodiment, the n-type impurity concentration of the n-type silicon film 14c and the p-type impurity concentration of the p-type silicon film 14d are lower than those in the first embodiment.

A feature of this embodiment is that the p-type silicon film 14b has a p-type impurity concentration higher than that of the p-type silicon film 14d and that the n-type silicon film 14a has an n-type impurity concentration higher than that of the n-type silicon film 14c.

A method for fabricating a semiconductor device according to the fourth embodiment will be described hereinafter with reference to the drawings. The method for fabricating a semiconductor device of this embodiment is different from that of the first embodiment only in the location of gate injection in the SRAM area (see FIGS. 14A-14F).

FIGS. 14A-14F are cross-sectional views illustrating a process step of the method for fabricating a semiconductor device of the fourth embodiment. FIG. 14A illustrates a cross-sectional structure in the process step taken along the line III-III (along the gate length) in FIG. 13A. FIG. 14B illustrates a cross-sectional structure in the process step taken along the line IV-IV (along the gate length) in FIG. 13A. FIG. 14C illustrates a cross-sectional structure in the process step taken along the line V-V (along the gate length) in FIG. 13C. FIG. 14D illustrates a cross-sectional structure in the process step taken along the line VI-VI (along the gate length) in FIG. 13C. FIG. 14E illustrates a cross-sectional structure in the process step taken along the line I-I (along the gate width) in FIG. 13A. FIG. 14F illustrates a cross-sectional structure in the process step taken along the line II-II (along the gate width) in FIG. 13C.

In this embodiment, first, the same process step as that of the first embodiment illustrated in FIGS. 2A-2F is performed. Thereafter, as illustrated in FIGS. 14A-14F, the surface of a semiconductor substrate 10 is cleaned with, for example, diluted hydrogen fluoride, and then a gate insulating film 13 of, for example, a silicon dioxide film with a thickness of about 2 nm is deposited by, for example, ISSG oxidation on the active regions 10a, 10b, 10c, and 10d. Subsequently, the semiconductor substrate 10 is subjected to, for example, a nitrogen plasma process, thereby nitriding the surface of the gate insulating film 13 to form a nitrided layer (not shown). Then, annealing is performed, thereby removing nitrogen atoms with weak bonds from the nitrided layer. Subsequently, a silicon film 14 of, for example, polysilicon with a thickness of about 100 nm is deposited by, for example, CVD over the gate insulating film 13.

Then, as illustrated in FIGS. 14A-14F, with a mask pattern 51D covering the entire NMIS region in the logic area and the entire SRAM area (i.e., the entire NMIS region and the entire PMIS region in the SRAM area) and exposing the entire PMIS region in the logic area, ions of a p-type impurity such as boron (B) are implanted into the silicon film 14 at a dose of $4 \times 10^{15}$ cm$^{-2}$, thereby forming a p-type silicon film 14P in the entire PMIS region in the logic area. Thereafter, with a mask pattern 52D covering the entire PMIS region in the logic area and the entire SRAM area (i.e., the entire NMIS region and the entire PMIS region in the SRAM area) and exposing the entire NMIS region in the logic area, ions of an n-type impurity such as phosphorus (P) are implanted into the silicon film 14 at a dose of $3 \times 10^{15}$ cm$^{-2}$, thereby forming an n-type silicon film 14N in the entire NMIS region in the logic area. That is, in this embodiment, no gate injection is performed on any of the NMIS region and the PMIS region in SRAM area, as in the third embodiment.

Formation of the p-type silicon film 14P and formation of the n-type silicon film 14N may be performed in any order. In FIGS. 14A-14F, not resist patterns formed on the semiconductor substrate 10 by photolithography but mask patterns on photomasks for forming these resist patterns are schematically shown as the mask patterns 51D and 52D for simplicity. The mask patterns 51D and 52D are designed such that a PN boundary 41L between the p-type silicon film 14P and the n-type silicon film 14N is located on a portion of the isolation region 11 between the active region 10a and the active region 10b.

After formation of the p-type silicon film 14P and the n-type silicon film 14N, the semiconductor substrate 10 is subjected to heat treatment at, for example, 850° C. for 30 seconds, thereby uniformizing a vertical profile of an impurity implanted in the form of ions into each of the p-type silicon film 14P and the n-type silicon film 14N.

Thereafter, process steps similar to the process step (gate patterning) illustrated in FIGS. 4A-4F, the process step (formation of offset spacers and shallow source/drain regions) illustrated in FIGS. 5A-5F, the process step (formation of sidewall spacers and deep source/drain regions) illustrated in FIGS. 6A-6F, the process step (formation of a silicide layer) illustrated in FIGS. 7A-7F, and the process step (formation of an interlayer insulating film and a contact silicide layer) illustrated in FIGS. 8A-8F of the first embodiment are performed in order.

In the foregoing manner, the semiconductor device of this embodiment, i.e., the semiconductor device including: an NMISFET located in the logic area and including the gate electrode 30a having the n-type silicon film 14a; a PMISFET located in the logic area and including the gate electrode 30b having the p-type silicon film 14b; an NMISFET located in the SRAM area and including the gate electrode 30c having the n-type silicon film 14c; and a PMISFET located in the SRAM area and including the gate electrode 30d having the p-type silicon film 14d, can be fabricated.

In this embodiment, in forming the gate electrodes 30a-30d by dry-etching the silicon film 14, no impurities are implanted into portions of the silicon film 14 constituting the gate electrodes 30c and 30d in the SRAM area susceptible to the influence of mutual diffusion of the impurities because of a small width of the isolation region 11 (specifically a portion of the isolation region 11 between the active region 10c and the active region 10d). Accordingly, it is possible to avoid occurrence of difference in the etching speed of the silicon film 14 caused by difference between ion species of the implanted impurities. Thus, no difference occurs in gate dimensions between the gate electrode 30c of the NMISFET and the gate electrode 30d of the PMISFET, thereby reducing variations in transistor characteristics due to variations in gate length. In addition, in dry-etching the silicon film 14, it is necessary to uniformize the vertical profile of an impurity implanted into the silicon film 14 beforehand by annealing. However, in this embodiment, since no impurities are implanted into a portion of the silicon film 14 located in the SRAM area at the time when the silicon film 14 is etched, the influence of mutual diffusion (specifically diffusion in the direction parallel to the principal surface of the substrate) of the impurities due to the annealing is substantially negligible. As a result, variations in transistor characteristics can be further reduced.

In this embodiment, no impurities are implanted into portions of the silicon film 14 constituting the gate electrodes 30c and 30d in the SRAM area in gate injection, i.e., impurities are implanted into portions of the silicon film 14 constituting the gate electrodes 30c and 30d only in source/drain implantation. Thus, the gate electrodes 30c and 30d have resistances higher than those of the gate electrodes 30a and 30b in the logic area. However, since transistors for SRAM circuits do not need to operate at high speed, unlike transistors for logic circuits, the influence of, for example, a delay of the circuit speed due to increase in resistance of the gate electrodes 30c and 30d is small.

In the first through fourth embodiments, a silicon oxynitride film is used as a gate insulating film and a polysilicon electrode is used as a gate electrode, as examples. However, the present disclosure is not limited to these embodiments. Alternatively, the gate insulating film material may be a high-k material (e.g., an insulating material having a relative dielectric constant of 8 or more) typified by metal oxide such as alumina ($Al_2O_3$), hafnium oxide ($HfO_2$), or hafnium silicate ($HfSiO_x$), and the gate electrode structure may be a metal-inserted poly-silicon stack (MIPS) structure including a metal film of, for example, titanium nitride (TiN) or tantalum nitride (TaN) between the gate insulating film and the polysilicon film in addition to the polysilicon film. In such a case, advantages similar to those of the foregoing embodiments can be obtained. In the MIPS structure, the threshold voltage of a transistor is adjusted mainly by using the work function. This adjustment is determined by a combination of a high-k gate insulating film material and a metal film material. Specifically, the adjustment of the threshold voltage between the NMISFET and the PMISFET may be performed either by changing metal film materials while using the same high-k gate insulating film material or by changing high-k gate insulating film materials while using the same metal film material. Since formation of depletion in the gate electrode is reduced in the MIPS structure, the impurity concentration in the polysilicon film only needs to be set in consideration of gate resistance (resistance of a bulk region, resistance of a silicide/polysilicon interface, resistance of a polysilicon/metal interface). When each of the interface resistances has a sufficiently low resistance, gate resistance is low in a MIPS structure using a metal film.

In the first and second embodiments, to form the PMISFET in the SRAM area as a surface channel type, the n-type impurity concentration in gate injection is preferably lower than the p-type impurity concentration in source/drain implantation. However, in the case of employing an MIPS structure, in view of reducing the resistance of the silicon film and the interface resistances mentioned above, the n-type impurity concentration in gate injection may be higher than the p-type impurity concentration in source/drain implantation. Alternatively, no source/drain implantation may be performed on the silicon films constituting the gate electrodes in the SRAM area. In other words, only gate injection of an n-type impurity may be performed on the silicon films constituting the gate electrodes in the SRAM area. This process changes all the silicon films constituting the gate electrodes of the CMISFETs in the SRAM area into n-type silicon films. In this case, only gate injection of an n-type impurity may be performed on the silicon films constituting the gate electrodes in the logic area, without performing source/drain implantation. This process also changes all the silicon films constituting the gate electrodes of the CMISFET in the logic area into n-type silicon films.

In the third and fourth embodiments, no gate injection is performed on the silicon films constituting the gate electrodes in the SRAM area. However, in the case of employing an MIPS structure, gate injection does not need to be performed on the silicon films constituting the gate electrodes in the SRAM area and the logic area. In other words, only source/drain implantation may be performed on the silicon films constituting the gate electrodes in the SRAM area and the logic area.

The first through fourth embodiments are directed to semiconductor device including logic circuits and SRAM circuits. However, the present disclosure is not limited to these embodiments. For example, in the case of including input/output circuits instead of the logic circuits, the dual-gate electrodes for logic circuits of the above embodiments are applicable. Specifically, the two types of dual-gate electrodes described in each of the above embodiments can be selectively used depending on the width of the isolation region between a pair of active regions where CMISFETs are to be formed. Specifically, the dual-gate electrodes for logic circuits described in the above embodiments may be used for CMISFETs with a relatively wide isolation region, whereas the dual-gate electrodes for SRAM circuits described in the above embodiments may be used for CMISFETs with a relatively narrow isolation region.

What is claimed is:

1. A semiconductor device, comprising:
a first dual-gate electrode; and
a second dual-gate electrode being separated from the first dual-gate electrode, wherein
the first dual-gate electrode includes a first gate electrode located on a first active region and having a first silicon film of a first conductivity type and a second gate electrode located on a second active region and having a first silicon film of a second conductivity type,
the second dual-gate electrode includes a third gate electrode located on a third active region and having a second silicon film of the first conductivity type and a fourth gate electrode located on a fourth active region and having a second silicon film of the second conductivity type,
the first active region and the second active region are isolated from each other with an isolation region interposed therebetween,
the first gate electrode and the second gate electrode are connected to each other on the isolation region, and
at least a portion of the first silicon film of the first conductivity type has a first-conductivity-type impurity concentration higher than that of a portion of the second silicon film of the first conductivity type located on the third active region.

2. The semiconductor device of claim 1, wherein an isolation width between the first active region and the second active region is larger than that between the third active region and the fourth active region.

3. The semiconductor device of claim 1, wherein at least a portion of the first silicon film of the second conductivity type has a second-conductivity-type impurity concentration substantially equal to that of a portion of the second silicon film of the second conductivity type located on the fourth active region.

4. The semiconductor device of claim 1, wherein a portion of the first silicon film of the first conductivity type located on the first active region has a first-conductivity-type impurity concentration higher than that of a portion of the second silicon film of the first conductivity type located on the third active region.

5. The semiconductor device of claim 1, wherein a portion of the first silicon film of the first conductivity type located on the first active region has a first-conductivity-type impurity concentration lower than that of a portion of the first silicon film of the first conductivity type located on the isolation region.

6. The semiconductor device of claim 1, wherein a portion of the first silicon film of the second conductivity type located on the second active region has a second-conductivity-type impurity concentration lower than that of a portion of the second silicon film of the second conductivity type located on the fourth active region.

7. The semiconductor device of claim 1, wherein a portion of the first silicon film of the second conductivity type located on the second active region has a second-conductivity-type impurity concentration lower than that of a portion of the first silicon film of the second conductivity type located on the isolation region.

8. The semiconductor device of claim 1, wherein a portion of the first silicon film of the first conductivity type located on the first active region has a first-conductivity-type impurity concentration substantially equal to that of a portion of the first silicon film of the first conductivity type located on the isolation region.

9. The semiconductor device of claim 1, wherein a portion of the first silicon film of the first conductivity type located on the isolation region has a first-conductivity-type impurity concentration higher than that of a portion of the second silicon film of the first conductivity type located on the third active region.

10. The semiconductor device of claim 1, wherein a portion of the first silicon film of the first conductivity type located on the first active region has a first-conductivity-type impurity concentration substantially equal to that of a portion of the second silicon film of the first conductivity type located on the third active region.

11. The semiconductor device of claim 1, wherein a portion of the first silicon film of the second conductivity type located on the second active region has a second-conductivity-type impurity concentration substantially equal to that of a portion of the second silicon film of the second conductivity type located on the fourth active region.

12. The semiconductor device of claim 1, wherein
a portion of the first silicon film of the first conductivity type located on the first active region has a first-conductivity-type impurity concentration higher than that of a portion of the second silicon film of the first conductivity type located on the third active region, and
a portion of the first silicon film of the second conductivity type located on the second active region has a second-conductivity-type impurity concentration higher than that of a portion of the second silicon film of the second conductivity type located on the fourth active region.

13. The semiconductor device of claim 1, wherein
the first gate electrode is a gate electrode of a first PMIS transistor,
the second gate electrode is a gate electrode of a first NMIS transistor,
the third gate electrode is a gate electrode of a second PMIS transistor, and
the fourth gate electrode is a gate electrode of a second NMIS transistor.

14. The semiconductor device of claim 1, wherein
each of the first gate electrode and the second gate electrode is a gate electrode of a transistor for a logic circuit, and
each of the third gate electrode and the fourth gate electrode is a gate electrode of a transistor for an SRAM circuit.

* * * * *